United States Patent
Yokouchi et al.

(10) Patent No.: US 8,190,281 B2
(45) Date of Patent: May 29, 2012

(54) SUBSTRATE PROCESSING APPARATUS, METHOD FOR EXAMINING SUBSTRATE PROCESSING CONDITIONS, AND STORAGE MEDIUM

(75) Inventors: Takeshi Yokouchi, Miyagi-gun (JP); Fumiko Yagi, Miyagi-gun (JP)

(73) Assignee: Tokyo Electron Limited, Tokyo (JP)

( * ) Notice: Subject to any disclaimer, the term of this patent is extended or adjusted under 35 U.S.C. 154(b) by 1219 days.

(21) Appl. No.: 11/682,490

(22) Filed: Mar. 6, 2007

(65) Prior Publication Data

US 2007/0212846 A1 Sep. 13, 2007

Related U.S. Application Data

(60) Provisional application No. 60/783,823, filed on Mar. 21, 2006.

(30) Foreign Application Priority Data

Mar. 8, 2006 (JP) ................................. 2006-062882

(51) Int. Cl.
*G06F 19/00* (2006.01)
(52) U.S. Cl. ......... 700/102; 700/108; 700/112; 700/177
(58) Field of Classification Search .................... 700/97, 700/100–102, 108–110, 114, 121, 164, 169, 700/174, 177, 182, 112; 726/2, 26, 27; 702/81, 702/84, 182–185, 188
See application file for complete search history.

(56) References Cited

U.S. PATENT DOCUMENTS

| | | | | |
|---|---|---|---|---|
| 3,668,653 A * | 6/1972 | Fair et al. | ........................... | 700/1 |
| 7,047,101 B1 * | 5/2006 | Young et al. | .................. | 700/121 |
| 2003/0014145 A1 | 1/2003 | Reiss et al. | | |
| 2003/0149506 A1 * | 8/2003 | Haanstra et al. | .............. | 700/121 |
| 2005/0217581 A1 | 10/2005 | Higashi et al. | | |
| 2006/0015206 A1 * | 1/2006 | Funk et al. | ..................... | 700/121 |
| 2007/0156272 A1 * | 7/2007 | Winstead et al. | ............... | 700/97 |

FOREIGN PATENT DOCUMENTS

| | | |
|---|---|---|
| JP | 2003-228412 | 8/2003 |
| JP | 2004-319961 | 11/2004 |
| WO | WO 2006/019449 | 2/2006 |

OTHER PUBLICATIONS

Japanese Office Action issued Oct. 21, 2010, in Patent Application No. 2006-062882 (with English-language translation of the relevant portions).

* cited by examiner

*Primary Examiner* — Sean Schechtman
(74) *Attorney, Agent, or Firm* — Oblon, Spivak, McClelland, Maier & Neustadt, L.L.P.

(57) ABSTRACT

A substrate processing apparatus includes a substrate processing unit for performing a process on substrates; a recipe protection unit for prohibiting processing conditions for the process from being changed while the process is being performed on a specific number of substrates; a protection cancellation unit for canceling a prohibition of a change in the process to allow the processing conditions to be changed while the process is being performed on the specific number of substrates; and a modifying unit for modifying the processing conditions. Further, a method for examining substrate processing conditions includes a protection cancellation step of canceling a prohibition of a change in the process to allow the processing conditions to be changed while the process is being performed on the specific number of substrates; and a modifying step of modifying the processing conditions.

13 Claims, 14 Drawing Sheets

SUBSTRATE PROCESSING APPARATUS, METHOD FOR EXAMINING SUBSTRATE PROCESSING CONDITIONS, AND STORAGE MEDIUM

FIELD OF THE INVENTION

The present invention relates to a substrate processing apparatus, a method for examining substrate processing conditions, and a storage medium, wherein the substrate processing apparatus is capable of examining substrate processing conditions.

BACKGROUND OF THE INVENTION

In a substrate processing apparatus for performing a process such as a plasma process on a wafer that serves as a substrate, processing conditions of the plasma process for the wafer are not usually changed while processing a specific number of wafers, wherein the specific number is equivalent to the number of wafers forming one lot. Furthermore, a set of the processing conditions of the plasma process performed in the substrate processing apparatus is called a recipe, which is stored in a server or the like connected to the substrate processing apparatus.

The substrate processing apparatus includes a process unit for performing the plasma process on each wafer in a processing chamber; a loader unit for unloading a wafer to transfer it from a container that accommodates the specific number of wafers; and a load-lock unit for transmitting wafers between the loader unit and the process unit. While the substrate processing apparatus processes the specific number of wafers, the wafers are transferred between the process units, the loader unit and the load-lock units (see, for an example, Japanese Patent Publication Application No. 2004-319961, FIG. 7).

Meanwhile, the examination of a recipe for a plasma process is performed by using the substrate processing apparatus itself. Specifically, when a plasma process based on a given recipe is performed on a wafer, a light emitting state of the plasma within the process chamber of each process unit is measured, and the recipe (e.g., a pressure in the process chamber and/or a flow rate of a processing gas) is modified based on the results of the measurement. In this manner, a recipe for the plasma process that can achieve desired results can be found out.

However, in the conventional substrate processing apparatus, a recipe cannot be modified until the plasma process has been performed on all of the specific number of the wafers, and therefore, for modifying the recipe, it is necessary to wait until the plasma process is completed on all the wafers, or it is necessary to remove all the wafers from the substrate processing apparatus. More specifically, it is necessary to return all of the wafers into the container even in a case where the plasma process is not performed on all of the specific number of the wafers. Therefore, a significant amount of time is consumed before examining the recipe.

SUMMARY OF THE INVENTION

It is, therefore, an object of the present invention to provide a substrate processing apparatus, a method for examining substrate processing conditions, and a storage medium, which are configured such that processing conditions for substrates can be examined without delay.

In accordance with an aspect of the present invention, there is provided a substrate processing apparatus, including a substrate processing unit for performing a process on substrates; a recipe protection unit for prohibiting processing conditions for the process from being changed while the process is being performed on a specific number of substrates; a protection cancellation unit for canceling a prohibition of a change in the process to allow the processing conditions to be changed while the process is being performed on the specific number of substrates; and a modifying unit for modifying the processing conditions.

In accordance with another aspect of the present invention, there is provided a method for examining substrate processing conditions, which is to be performed by a substrate processing apparatus that includes a substrate processing unit for performing a process on substrates, and a recipe protection unit for prohibiting processing conditions for the process from being changed while the process is being performed on a specific number of substrates, the method including a protection cancellation step of canceling a prohibition of a change in the process to allow the processing conditions to be changed while the process is being performed on the specific number of substrates; and a modifying step of modifying the processing conditions.

In accordance with still another aspect of the present invention, there is provided a computer-readable storage medium storing a program for executing a method for examining substrate processing conditions to be performed by a substrate processing apparatus that includes a substrate processing unit for performing a process on substrates, and a recipe protection unit for prohibiting processing conditions for the process from being changed while the process is being performed on a specific number of substrates, wherein the program includes: a protection cancellation module for canceling a prohibition of a change in the process to allow the process conditions to be changed while the process is being performed on the specific number of substrates; and a modifying module for modifying the processing conditions.

In accordance with the substrate processing apparatus, the method for examining substrate processing conditions, and the storage medium described above, the prohibition of a processing condition change is cancelled while the specific number of substrates are being processed, so that the processing conditions are modified. Thus, the processing conditions can be modified without waiting until the process is completed on the specific number of substrates, and thus the substrate processing conditions can be examined without delay.

It is preferable that the substrate processing apparatus further includes a transfer recipe protection unit for prohibiting transfer of a substrate into the substrate processing unit, wherein, if the transfer of the substrates into the substrate processing unit has been prohibited, the modifying unit modifies the processing conditions.

In accordance with the substrate processing apparatus described above, a transfer of substrate into the substrate processing unit is prohibited. Therefore, even in a case where the substrate processing apparatus includes more than one substrate processing units and processing conditions for one of the substrate processing units are modified, the substrate processing apparatus need not be entirely stopped for preventing an erroneous transfer of substrate into the substrate processing unit for which the processing conditions have been modified, and the substrate process can be continued in another substrate processing unit. Thus, a reduction in productivity can be prevented. Further, since the processing conditions are modified while a transfer of substrate into the substrate processing unit is prohibited, the processing conditions for substrates can be efficiently examined without performing an unnecessary process on the substrates.

It is preferable that the substrate processing apparatus further includes a substrate transfer unit for transferring the substrates; and a determination unit for determining whether or not a change in substrate transfer conditions, that are required for transferring a substrate, has been prohibited in response to a manipulation from an external device for modifying the processing conditions; wherein, if the change in the substrate transfer conditions has not been prohibited, the determination unit also determines whether or not a transfer of a substrate into the substrate processing unit has been prohibited.

It is preferable that the method further includes a first determination step of determining whether or not a change in substrate transfer conditions required for transferring a substrate has been prohibited in response to a manipulation from an external device for modifying the processing conditions; and a second determination step of, if the change in the substrate transfer conditions has not been prohibited, determining whether or not a transfer of a substrate into the substrate processing unit has been prohibited.

In accordance with the above-described substrate processing apparatus and the above-described method for examining substrate processing conditions described above, it is determined whether or not the substrate transfer conditions required for transferring a substrate are prohibited from being modified in accordance with the manipulation from the external device for modifying the processing conditions. Further, if the substrate transfer conditions are not prohibited from being modified, it is further determined whether or not a transfer of substrates into the substrate processing unit is prohibited. In this manner, two determination procedures are performed before a substrate is carried into the substrate processing unit. Accordingly, even when there is a manipulation from the external device, an erroneous transfer of substrates into the substrate processing unit for which the processing conditions are being modified can be prevented.

In the substrate processing apparatus, it is preferable that, if the change in the substrate transfer conditions has been prohibited, the manipulation from the external device is not accepted.

In the method for examining substrate processing conditions, it is preferable that, if the change in the substrate transfer conditions has been prohibited, the manipulation from the external device is not accepted.

In accordance with the above-described substrate processing apparatus and the above-described method for examining substrate processing conditions, if the substrate transfer conditions are prohibited from being modified, a manipulation from the external device is not accepted. Therefore, it is guaranteed that the processing conditions are prevented from being erroneously modified.

In the substrate processing apparatus, it is preferable that, if the change in the substrate transfer conditions has been prohibited, a transmission of the processing conditions to an outside is prohibited.

In the method for examining substrate processing conditions, it is preferable that, if the change in the substrate transfer conditions has been prohibited, a transmission of the processing conditions to an outside is prohibited.

In accordance with the above-described substrate processing apparatus and the above-described method for examining substrate processing conditions, if the substrate transfer conditions are prohibited from being modified, a transmission of processing condition to the outside is prohibited. Thus, it is guaranteed that the processing conditions are prevented from being erroneously modified from outside.

It is preferable that the substrate processing apparatus further includes a setting unit for setting the processing conditions for the process to be performed on the specific number of substrates; and a condition decision unit for, when processing conditions different from the set processing conditions set by the setting unit are inputted, determining processing conditions for the process to be performed on the substrates by the substrate processing unit based on a difference between the inputted processing conditions and the set processing conditions set by the setting unit.

In accordance with the substrate processing apparatus described above, the processing conditions for a specific number of substrates are set in advance. Further, when processing conditions different from the set processing conditions are inputted, the processing conditions for the processes to be performed by the substrate processing unit are determined based on the difference between the inputted processing conditions and the set processing conditions. Thus, it can be prevented that the processes are performed according to processing conditions that differ significantly from the set processing conditions. If the processes were performed on the substrate according to processing conditions that differ significantly from the set processing conditions, the results of those processes would not be useful in modifying the set processing conditions appropriately. Therefore, in accordance with the substrate processing apparatus described above, a useless modification in the processing conditions can be prevented, so that the examination of the processing conditions for the substrates becomes more efficient.

It is preferable that the substrate processing apparatus further includes a process flow rearranging unit for modifying a process flow including a plurality of procedures by changing attributes of the procedures in the process flow.

It is preferable that the method further includes a process flow rearranging step of modifying a process flow including a plurality of procedures by changing attributes of the procedures in the process flow.

In accordance with the above-described substrate processing apparatus and the above-described method for examining substrate processing conditions, if a substrate process flow includes a plurality of procedures, the process flow can be modified by changing attributes of the respective procedures. Thus, the process flow can be easily modified.

It is preferable that the substrate processing apparatus further includes a process information storing unit for storing process information that at least includes process IDs that represent contents of the respective procedures in the process flow; a processing condition storing unit for storing processing conditions that include a sequence of the procedures; and a process flow determination unit for determining whether or not the sequence of the procedures is accepted or whether or not there is any sequence of the procedures for the processing conditions associated with the process IDs and processing condition IDs, wherein, if the sequence of the procedures is not accepted or there is no sequence of the procedures, the process flow rearranging unit modifies the sequence of the procedures by providing a warning, changing the sequence of the procedures, adding procedure(s) or removing any of the procedures.

It is preferable that the method further includes a process information storing step of storing process information that at least includes process IDs that represent contents of the respective procedures in the process flow; a processing condition storing step of storing processing conditions that include a sequence of the procedures; and a process flow determination step of determining whether or not the sequence of the procedures is accepted or whether or not there is any sequence of the procedures for the processing conditions associated with the process IDs and processing condition IDs, wherein, at the process flow rearranging step, if the sequence of the procedures is not accepted or there is no sequence of the procedures, the sequence of the procedures is modified by providing a warning, changing the sequence of the procedures, adding procedure(s) or removing any of the procedures.

In accordance with the above-described substrate processing apparatus and the above-described method for examining substrate processing conditions, process information at least including process IDs and processing conditions including the sequence of the procedures in the process flow are stored, wherein the process information represents contents of the respective procedures in the process flow. Then, in the processing conditions including the process IDs and the processing condition IDs, it is determined whether or not there exists any sequence of the process, or whether or not the sequence of the procedures are to be regarded as valid.

Then, if it is determined that there exists no sequence of the procedures or the sequence of the procedures is not to be regarded as valid, the process flow is modified by providing a warning to an operator, changing the sequence of the procedures, removing any of the procedures, or adding one or more procedures. Thus, until the process flow is modified, at least one determination is performed. Therefore, the process flow can be prevented from being carelessly modified.

In the method for examining substrate processing conditions, it is preferable that, if a transfer of a substrate into the substrate processing unit has been prohibited, the processing conditions are modified at the modifying step.

In accordance with the above-described method for examining substrate processing conditions, the processing conditions are modified while a transfer of substrate into the substrate processing unit is prohibited. Therefore, since it can be prevented that an unnecessary process is performed on the substrate, the examination of the processing conditions becomes more efficient.

In the method for examining substrate processing conditions, it is preferable that, if an abnormality occurs in the substrate processing unit, the processing conditions are modified at the modifying step.

In accordance with the above-described method for examining substrate processing conditions, when an abnormality occurs in the substrate processing unit, the processing conditions are modified. Thus, since it can be prevented that a process is performed on the substrate again under the processing conditions under which the abnormality occurred, the processing conditions for the substrates can be examined more efficiently without unnecessarily performing a process on the substrates.

BRIEF DESCRIPTION OF THE DRAWINGS

The above and other objects and features of the present invention will become apparent from the following description of embodiments, given in conjunction with the accompanying drawings, in which:

FIGS. 6A and 6B depict a process unit information screen displayed on the display unit of the operation panel, in which FIG. 6A shows a case where a transfer of wafer into the process unit is not prohibited, and FIG. 6B shows a case where a transfer of wafer into the process unit is prohibited;

DETAILED DESCRIPTION OF THE PREFERRED EMBODIMENTS

Hereinafter, embodiments of the present invention will be described in detail with reference to the accompanying drawings.

Firstly, a substrate processing apparatus in accordance with a first embodiment of the present invention will be discussed.

Figure 1:
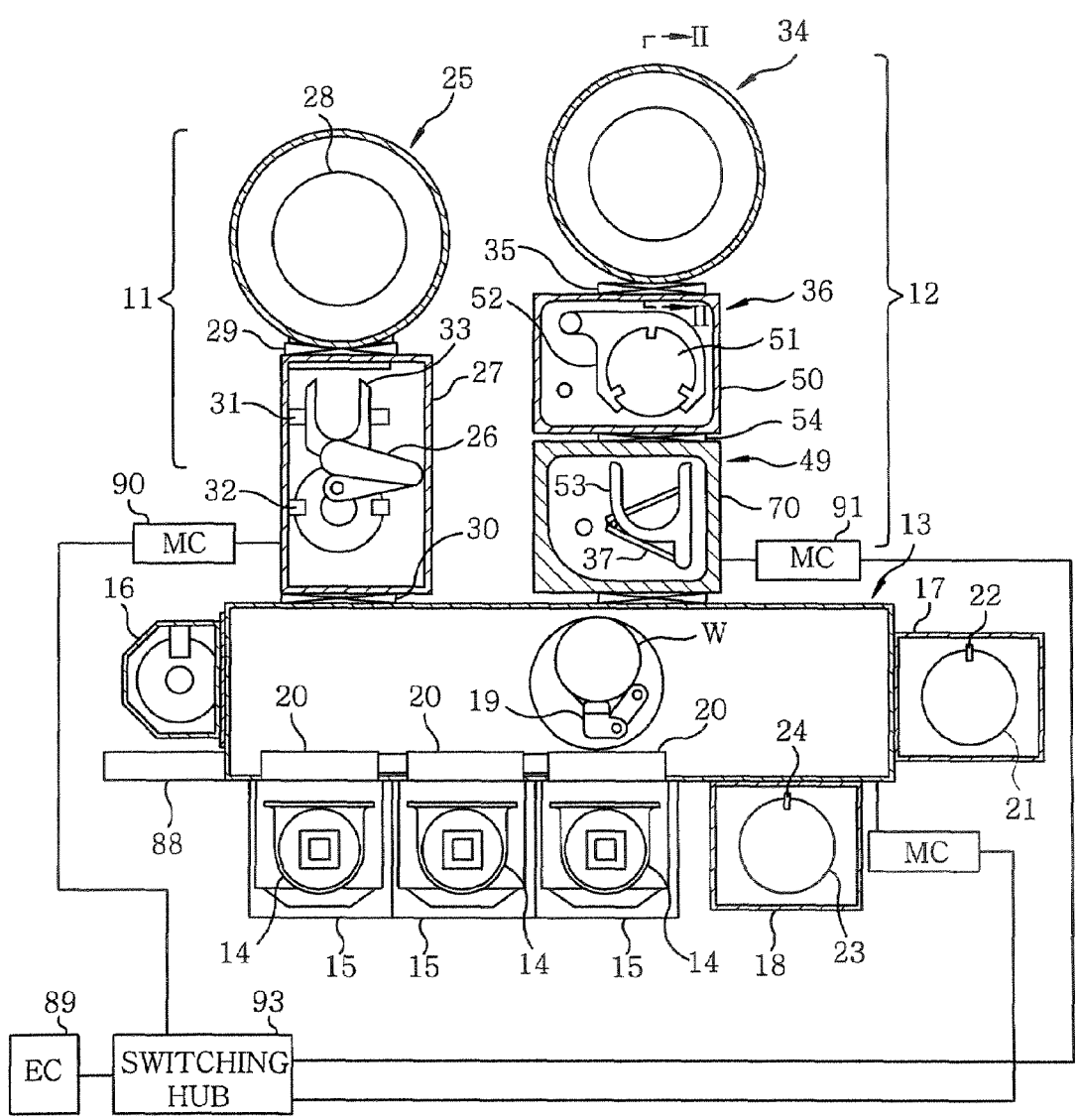
FIG. 1 is a plan view for schematically showing a configuration of a substrate processing apparatus in accordance with an embodiment of the present invention.

FIG. 1 is a plan view for schematically showing a configuration of a substrate processing apparatus in accordance with the first embodiment of the present invention.

As shown in FIG. 1, the substrate processing apparatus 10 includes a first process ship 11 for performing a reactive ion etching (hereinafter, referred to as "RIE") on a wafer for an electronic device (a substrate; hereinafter, simply referred to as a "wafer") W; a second process ship 12, which is disposed in parallel with the first process ship 11, for performing a COR (Chemical Oxide Removal) process and a PHT (Post Heat Treatment) process, which will be described below, on the wafer W that has undergone the RIE process in the first process ship 11; and a rectangular loader unit 13 that serves as a common transfer chamber connected to the first process ship 11 and the second process ship 12, respectively.

Herein, the COR process is a process in which an oxide film of a target object is chemically reacted with gas molecules to generate a product. Further, the PHT process is a process in which the COR processed target object is heated to remove the product, generated by the chemical reaction in the COR process, from the target object by vaporization and thermal oxidation. As mentioned above, the oxide film of the target object is removed by using neither plasma nor water in the COR and PHT processes, especially in the COR process. Therefore, the COR and PHT processes can be regarded as plasmaless and dry cleaning processes.

The loader unit 13 is connected to the first and the second process ship 11 and 12, three FOUP mounting tables 15, an orienter 16, and a first and a second IMS (Integrated Metrology System) 17 and 18. A FOUP (Front Opening Unified Pod) 14, which serves as a container for accommodating twenty-five wafers W equivalent to one lot, is mounted on each of the FOUP mounting tables 15. The orienter 16 performs a pre-alignment of the position of the wafer W unloaded from the FOUP 14, and the first and the second IMS 17 and 18, which is manufactured by, e.g., Therma-Wave, Inc., measures a surface state of the wafer W.

The first and the second process ship 11 and 12 are connected to a sidewall of the loader unit 13 arranged in a longitudinal direction thereof, and disposed to face the three FOUP mounting tables 15 across the loader unit 13. Further, the orienter 16 is disposed on one end portion in the longitudinal direction of the loader unit 13; the first IMS 17 is disposed on the other end portion in the longitudinal direction of the loader unit 13; and the second IMS 18 is disposed in line with the three FOUP mounting tables 15.

The loader unit 13 is provided with a dual scara arm type transfer arm unit 19 disposed therein for transferring the wafer W; and three loading ports 20 serving as input ports of the wafers, the three loading ports 20 disposed at a sidewall of the loader unit 13 in a manner respectively corresponding to the FOUP mounting tables 15. Each loading port 20 is coupled to one of the FOUPs 14 mounted on one of the FOUP mounting tables 15. By unloading the wafer W from the FOUP 14 mounted on the FOUP mounting table 15 via the loading port 20, the transfer arm unit 19 transfers the unloaded wafer W into and out of the first process ship 11, the second process ship 12, the orienter 16, the first IMS 17 and/or the second IMS 18.

The first IMS 17, which functions as an optical monitor, includes a mounting table 21 for mounting thereon the loaded wafer W; and an optical sensor 22 directed to the wafer W mounted on the mounting table 21 to measure a surface shape of the wafer W (for example, a film thickness of a surface layer, and a CD (Critical Dimension) value of a wiring trench or a gate electrode). The second IMS 18, which also functions as an optical monitor in the same manner as the first IMS 17, includes a mounting table 23 and an optical sensor 24, and measures the number of particles on the surface of the wafer W.

Further, the first process ship 11 includes a first process unit 25 for performing the RIE process on the wafer W; and a first load-lock unit 27 having therein a first transfer arm 26 of a link-shaped single pick type for transferring the wafer W to the first process unit 25.

The first process unit 25 includes a cylindrical processing chamber; and an upper and a lower electrode. The upper and the lower electrode are disposed in the processing chamber to be spaced from each other at a distance suitable for performing the RIE process on the wafer W. Further, an ESC 28 for chucking the wafer W by Coulomb force or the like is disposed at a top portion of the lower electrode.

In the first process unit 25, a processing gas is introduced into the chamber; and an electric field is generated between the upper and the lower electrode, so that the introduced processing gas is converted into a plasma to produce ions and radicals. Then, the RIE process is performed on the wafer W by using the ions and the radicals.

In the first process ship 11, an inside of the loader unit 13 is maintained at an atmospheric pressure, whereas an inside of the first process unit 25 is maintained at a vacuum level. Thus, the first load-lock unit 27 is configured as a vacuum antechamber having a vacuum gate valve 29 at a connection part of the first load-lock unit 27 connected to the first process unit 25, and an atmospheric gate valve 30 at a connection part of the first load-lock unit 27 connected to the loader unit 13, such that the internal pressure of the first load-lock unit 27 is controllable by the vacuum gate valve 29 and the atmospheric gate valve 30.

In the first load-lock unit 27, the first transfer arm 26 is installed approximately at a central portion thereof; a first buffer 31 is installed at a position that is located in a direction toward the first process unit 25 from the first transfer arm 26; and a second buffer 32 is installed at a position that is located in a direction toward the loader unit 13 from the first transfer arm 26. The first and the second buffer 31 and 32 are installed along a moving path of a supporting portion (a pick) 33 that supports the wafer W, wherein the supporting portion 33 is disposed at a leading end portion of the first transfer arm 26. Accordingly, by temporarily moving the wafer W on which the RIE process has been completed upward from the moving path of the supporting portion 33, the RIE processed wafer W can be easily replaced with an unprocessed wafer W (i.e., a wafer that is not yet RIE processed) in the first process unit 25.

The second process ship 12 includes a second process unit 34 for performing the COR process on the wafer W; a third process unit 36, connected to the second process unit 34 via a vacuum gate valve 35, for performing the PHT process on the wafer W; and a second load-lock unit 49 having therein a second transfer arm 37 of a link-shaped single pick type for transferring the wafer W to the second process unit 34 and the third process unit 36.

Figure 2A:
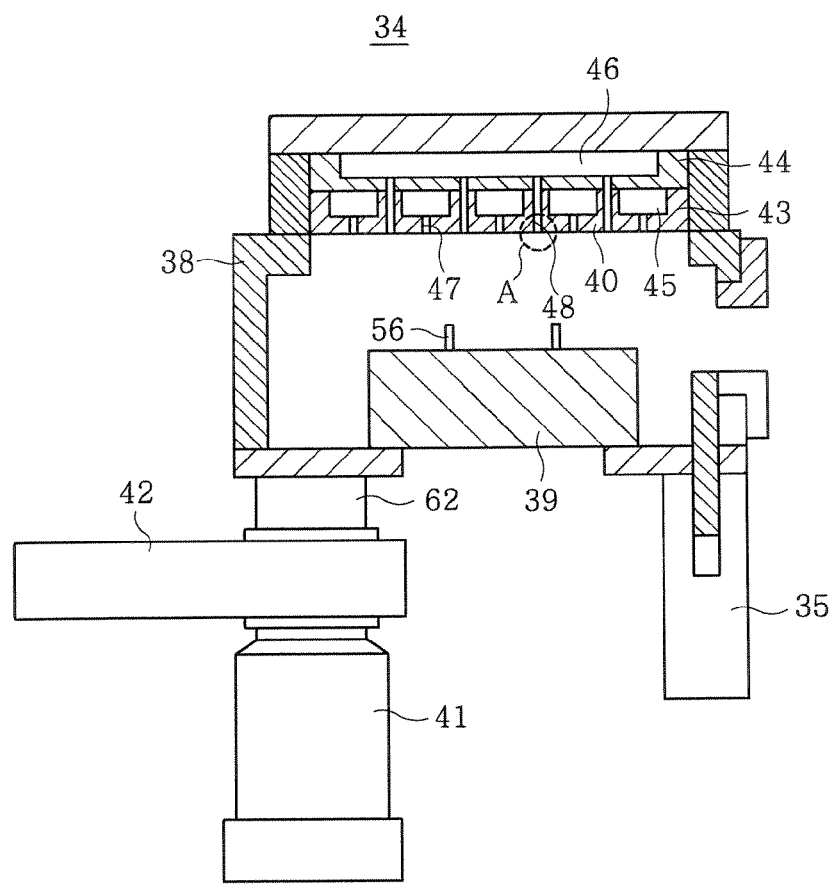
FIG. 2A is a cross sectional view of a second process unit of FIG. 1, which is taken along the line II-II of FIG. 1.
Figure 2B:
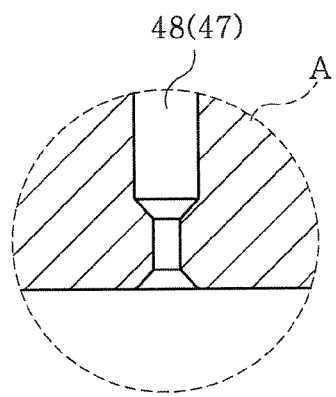
FIG. 2B is an enlarged view of a portion A in FIG. 2A.

FIG. 2A is a cross sectional view of the second process unit 34 of FIG. 1, which is taken along the line II-II of FIG. 1; and FIG. 2B is an enlarged view of a portion A in FIG. 2A.

As shown in FIG. 2A, the second process unit 34 includes a cylindrical processing chamber 38; an ESC 39 serving as a mounting table of the wafer W, disposed in the processing chamber 38; a shower head 40 disposed at an upper portion of the processing chamber 38; a TMP (Turbo Molecular Pump) 41 for exhausting gas or the like from the processing chamber 38; and an APC (Automatic Pressure Control) valve 42, disposed between the processing chamber 38 and the TMP 41, serving as a variable butterfly valve which controls a pressure in the processing chamber 38.

The ESC 39 has an electrode plate (not shown) therein to which a DC voltage is applied, and adsorptively holds the wafer W by Coulomb force or Johnsen-Rahbek force generated by the DC voltage. Further, the ESC 39 has a coolant chamber (not shown) serving as a temperature controlling mechanism. A coolant of a specific temperature such as cooling water or galden solution is circulated and supplied into this coolant chamber, so that the processing temperature of the wafer W adsorptively held on the top surface of the ESC 39 can be controlled by the temperature of the coolant.

Moreover, the ESC 39 has a thermally conductive gas feeding system (not shown) to supply a thermally conductive gas (helium gas) to an entire space between the top surface of the ESC 39 and a backside of the wafer. During the COR process, the thermally conductive gas exchanges heat between the ESC 39 maintained at a desired temperature by the coolant and the wafer, thereby efficiently and evenly cooling the wafer.

Meanwhile, the ESC 39 has a plurality of pusher pins 56 serving as lift pins capable of protruding from the top surface thereof. The pusher pins 56 are accommodated in the ESC 39 when the wafer W is adsorptively held on the ESC 39. However, when the COR processed wafer W is to be unloaded from the processing chamber 38, the pusher pins 56 protrude from the top surface of the ESC 39 to lift up the wafer W.

The shower head 40 is of a two-layer structure in which a first and a second buffer chamber 45 and 46 are respectively disposed at a lower and an upper portion 43 and 44 thereof. The first and the second buffer chamber 45 and 46 communicate with the inside of the processing chamber 38 via gas holes 47 and 48, respectively. In other words, the shower head 40 is formed of two flat plates (the lower and the upper portion 43 and 44) of a laminated structure, each of which has an internal passage through which a gas supplied to the first buffer chamber 45 or the second buffer chamber 46 is introduced to the processing chamber 38.

When the COR process is performed on the wafer W, an $NH_3$ (ammonia) gas is supplied into the first buffer chamber 45 through an ammonia gas supply line 57 which will be described later. Then, the supplied ammonia gas is supplied into the processing chamber 38 through the gas holes 47. Meanwhile, an HF (hydrogen fluoride) gas is supplied into the second buffer chamber 46 from a hydrogen fluoride gas supply line 58 that will be described later. Thereafter, the hydrogen fluoride gas is supplied into the processing chamber 38 through the gas holes 48.

Further, the shower head 40 has therein a heater (not shown) such as a heating element. The heating element is preferably disposed in the upper portion 44 to control the temperature of the hydrogen fluoride gas in the second buffer chamber 46.

Further, as shown in FIG. 2B, each of the gas holes 47 and 48 is formed such that, at a vicinity of the chamber 38, a horizontal cross section thereof becomes larger as it gets closer to the processing chamber 38. Thus, the ammonia gas and the hydrogen fluoride gas can be efficiently diffused into the processing chamber 38. Furthermore, since each of the gas holes 47 and 48 has a vertical cross section of a narrowed neck portion, deposits generated in the processing chamber 38 can be prevented from flowing backwards to the gas holes 47 and 48, or to the first and the second buffer chamber 45 and 46. Moreover, the gas holes 47 and 48 may be of a spiral shape.

The second process unit 34 performs the COR process on the wafer W by controlling the pressure in the processing chamber 38 and a volumetric flow rate ratio of the ammonia gas to the hydrogen fluoride gas. Here, the second process unit 34 is designed such that the ammonia gas and the hydrogen fluoride gas are to be mixed first in the processing chamber 38 (a post-mix type). Thus, since the two gases are kept from being mixed until injected into the processing chamber 38, the ammonia gas and the hydrogen fluoride gas are prevented from being chemically reacted before being introduced into the processing chamber 38.

Further, in the second process unit 34, the sidewall of the processing chamber 38 has therein a heater (not shown) such as a heating element, and the ambient temperature of the processing chamber 38 is kept from being reduced. Thus, the reproducibility of the COR process can be improved. Further, the heating element embedded in the sidewall prevents by-products generated in the processing chamber 38 from being attached onto the inner sidewall by controlling the temperature of the sidewall.

Returning to FIG. 1, the third process unit 36 includes a processing chamber 50 of a shape of housing; a stage heater 51 serving as a mounting table of the wafer W disposed in the processing chamber 50; a buffer arm 52, disposed around the stage heater 51, for lifting up the wafer W mounted on the stage heater 51; and a PHT chamber lid (not shown) serving as a lid that can be freely opened and closed for isolating the inner chamber atmosphere from the outer chamber atmosphere.

The stage heater 51 is formed of aluminum having an oxidized film formed thereon, and heats the mounted wafer W to a specific temperature by using a built-in heating wire or the like. To be specific, the stage heater 51 directly heats the mounted wafer W for at least one minute to a temperature of 100 to 200° C., preferably to a temperature of about 135° C.

A sheath heater formed of silicon rubber is disposed in the PHT chamber lid. A cartridge heater (not shown) is built in the sidewall of the processing chamber 50 to control the temperature of the wall surface of the sidewall of the processing chamber 50 to be within a range from 25 to 80° C. Therefore, the by-products can be prevented from being attached onto the sidewall of the processing chamber 50, and particle generation due to the attached by-products can be prevented, so that a cleaning cycle of the processing chamber 50 can be extended. Further, the peripheral portion of the processing chamber 50 is covered by a heat shield.

Instead of the sheath heater, a UV radiation heater may be disposed as a heater for heating the wafer W from above. As the UV radiation heater, a UV lamp capable of radiating ultraviolet light whose wavelength is within a range from 190 to 400 nm can be employed.

Since the buffer arm 52 moves the COR processed wafer W temporarily upward from the moving path of the supporting portion 53 of the second transfer arm 37, the wafer W can be easily replaced in the second process unit 34 or the third process unit 36.

The third process unit 36 performs the PHT process on the wafer W by controlling a temperature of the wafer W.

The second load-lock unit 49 includes a transfer chamber 70 of a shape of housing having therein the second transfer arm 37. Further, the inside of the loader unit 13 is maintained at an atmospheric pressure, whereas the insides of the second and the third process unit 34 and 36 are maintained at a vacuum level. Thus, the second load-lock unit 49 is configured as a vacuum antechamber having a vacuum gate valve 54 at a connection part of the second load-lock unit 49 connected to the third process unit 36, and an atmospheric door valve 55 at a connection part of the second load-lock unit 49 connected to the loader unit 13, such that the internal pressure of the second load-lock unit 49 is controllable by the vacuum gate valve 54 and the atmospheric door valve 55.

Figure 3:
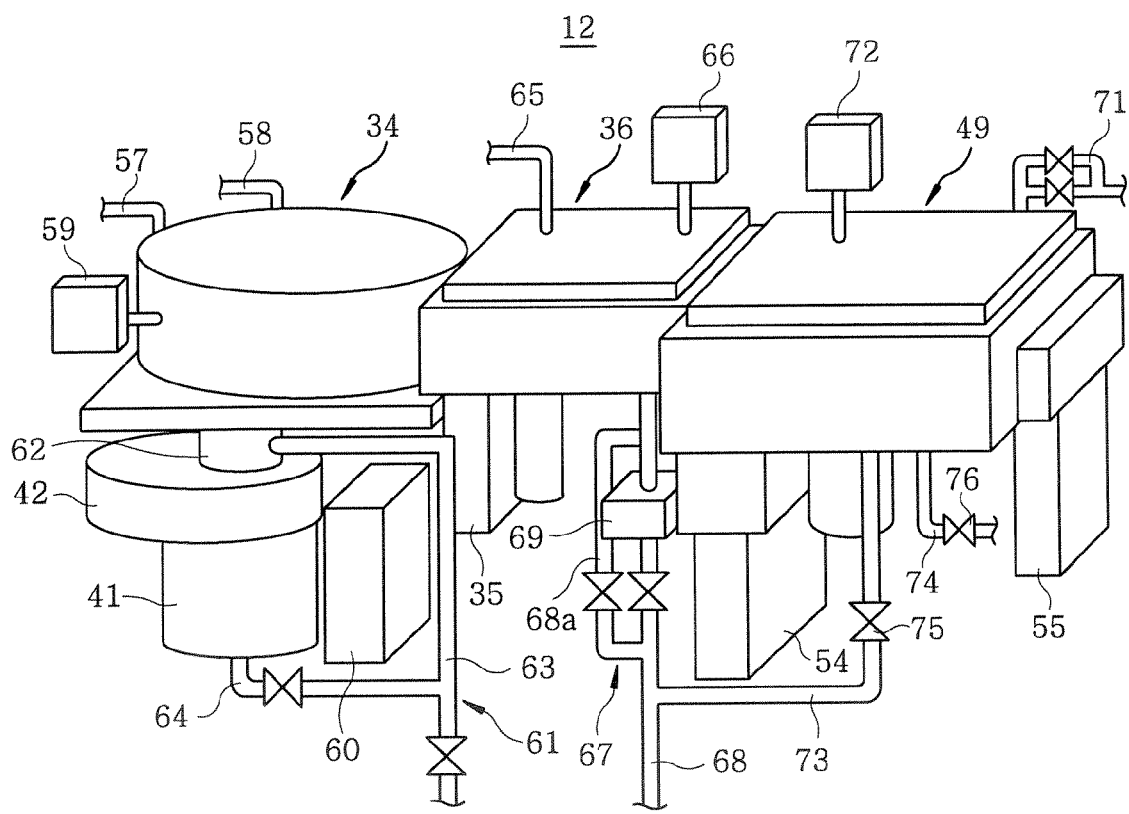
FIG. 3 is a perspective view for schematically showing a configuration of a second process ship of FIG. 1.

FIG. 3 is a perspective view for schematically showing a configuration of the second process ship 34 of FIG. 1.

As shown in FIG. 3, the second process unit 34 includes the ammonia gas supply line 57 for supplying the ammonia gas into the first buffer chamber 45; the hydrogen fluoride gas supply line 58 for supplying the hydrogen fluoride gas into the second buffer chamber 46; a pressure gauge 59 for measuring the pressure in the processing chamber 38; and a chiller unit 60 for supplying a coolant to a cooling system disposed in the ESC 39.

An MFC (Mass Flow Controller; not shown) is provided on the ammonia gas supply line 57, and the MFC controls a flow rate of the ammonia gas supplied into the first buffer chamber 45. Further, another MFC (not shown) is provided on the hydrogen fluoride gas supply line 58, and the MFC controls a flow rate of the hydrogen fluoride gas supplied into the second buffer chamber 46. The MFC of the ammonia gas supply line 57 and the MFC of the hydrogen fluoride gas supply line 58 cooperate to control the volumetric flow rate ratio of the ammonia gas and the hydrogen fluoride gas supplied into the processing chamber 38.

Further, a second process unit exhaust system 61 connected to a DP (Dry Pump; not shown) is disposed below the second process unit 34. The second process unit exhaust system 61 includes a gas exhaust line 63 for communicating with an exhaust duct 62 disposed between the processing chamber 38 and the APC valve 42; and a gas exhaust line 64 connected to an underside (an exhausting side) of the TMP 41, thereby exhausting gas or the like from the processing chamber 38. Further, the gas exhaust line 64 is coupled to the gas exhaust line 63 immediately before the DP.

The third process unit 36 includes a nitrogen gas supply line 65 for supplying a nitrogen (N$_2$) gas into the processing chamber 50; a pressure gauge 66 for measuring the pressure in the processing chamber 50; and a third process unit exhaust system 67 for exhausting the nitrogen gas or the like from the processing chamber 50.

An MFC (not shown) is provided on the nitrogen gas supply line 65 to control a flow rate of the nitrogen gas supplied to the processing chamber 50. The third process unit exhaust system 67 includes a main exhaust line 68 connected to a DP for communicating with the processing chamber 50; an APC valve 69 disposed in the main exhaust line 68; and an auxiliary exhaust line 68a branched off from the main exhaust line 68 to bypass the APC valve 69, and connected to the main exhaust line 68 immediately before the DP. The APC valve 69 controls the pressure in the processing chamber 50.

The second load-lock unit 49 includes a nitrogen gas supply line 71 for supplying a nitrogen gas into the transfer chamber 70; a pressure gauge 72 for measuring a pressure in the transfer chamber 70; a second load-lock unit exhaust system 73 for exhausting the nitrogen gas or the like from the transfer chamber 70; and an atmosphere communicating pipe 74 for opening an inside of the transfer chamber 70 to an atmosphere.

An MFC (not shown) is provided on the nitrogen gas supply line 71 to control a flow rate of the nitrogen gas supplied to the transfer chamber 70. The second load-lock unit exhaust system 73, configured with one gas exhaust line, communicates with the transfer chamber 70 and is connected to the main exhaust line 68 of the third process unit exhaust system 67 immediately before the DP. Further, the second load-lock unit exhaust system 73 and the atmosphere communicating pipe 74 have an exhaust valve 75 and a relief valve 76, respectively. The exhaust valve 75 and the relief valve 76, capable of being freely opened and closed, cooperate to control the pressure in the transfer chamber 70 to a desired pressure within a range from an atmospheric pressure to a vacuum level.

Returning to FIG. 1, the substrate processing apparatus 10 further includes a system controller for controlling operations of the first process ship 11, the second process ship 12 and the loader unit 13; and an operation panel 88 disposed on one end portion in the longitudinal direction of the loader unit 13.

The operation panel 88 includes a display configured with, e.g., an LCD (Liquid Crystal Display) to indicate a current operational state of each component of the substrate processing apparatus 10.

Figure 4:
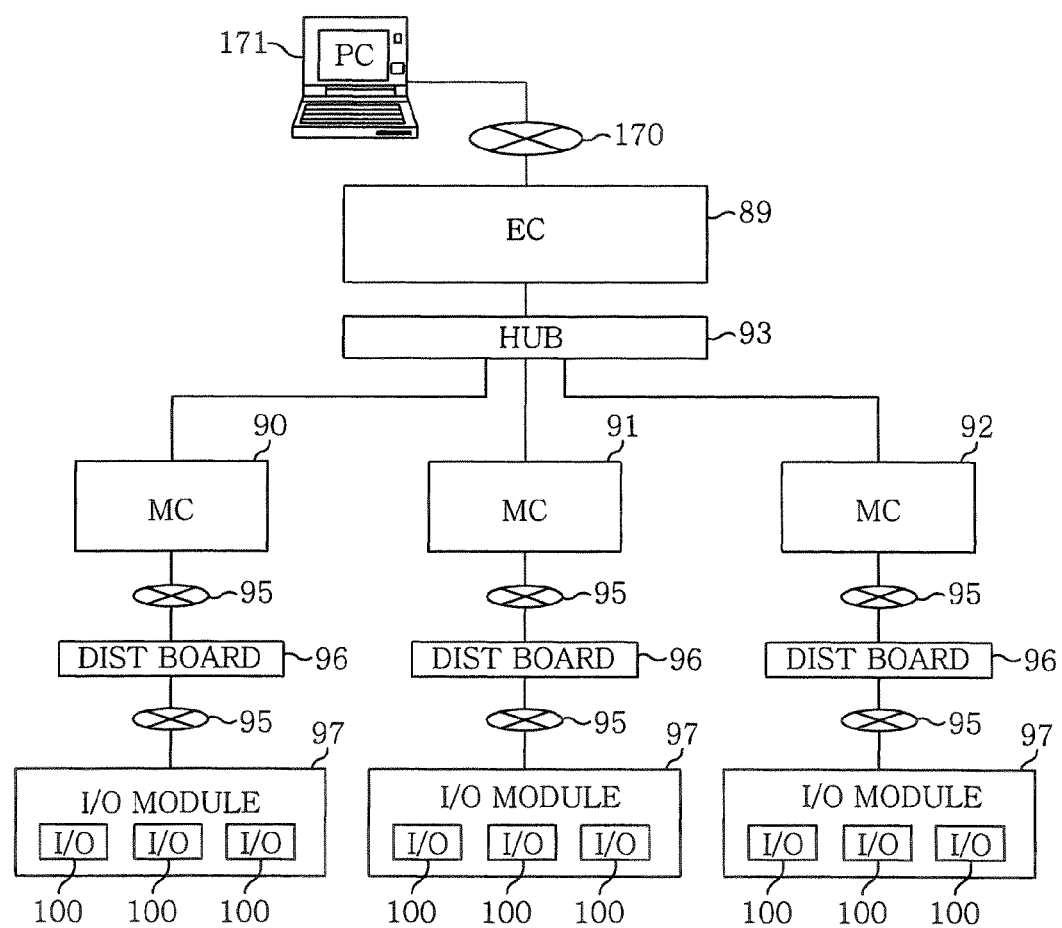
FIG. 4 describes a schematic configuration of a system controller in the substrate processing apparatus of FIG. 1.

As shown in FIG. 4, the system controller includes an EC (Equipment Controller) 89; three MCs (Module Controllers) 90, 91 and 92; and a switching hub 93 for connecting the EC 89 to each MC. In the system controller, the EC 89 is connected to a PC 171 serving as a MES (Manufacturing Execution System) through a LAN (Local Area Network) 170, wherein the MES manages the manufacturing processes carried out in the entire factory where the substrate processing apparatus 10 is installed. The MES provides feedback of real time information on the processes performed in the factory to a basic operation system (not shown) by cooperating with the system controller, and performs determinations about the processes by considering, e.g., a total load of the factory.

The EC 89 is a main control unit (a master control unit) for controlling operations of the entire substrate processing apparatus 10 by controlling each MC. Further, the EC 89 includes a CPU, a RAM, an HDD and the like, and controls operations of the first process ship 11, the second process ship 12 and the loader unit 13 by transmitting control signals thereto according to processing conditions for the wafer W, i.e., a program corresponding to a recipe set by an operator or the like through the operation controller 88.

Figure 14:
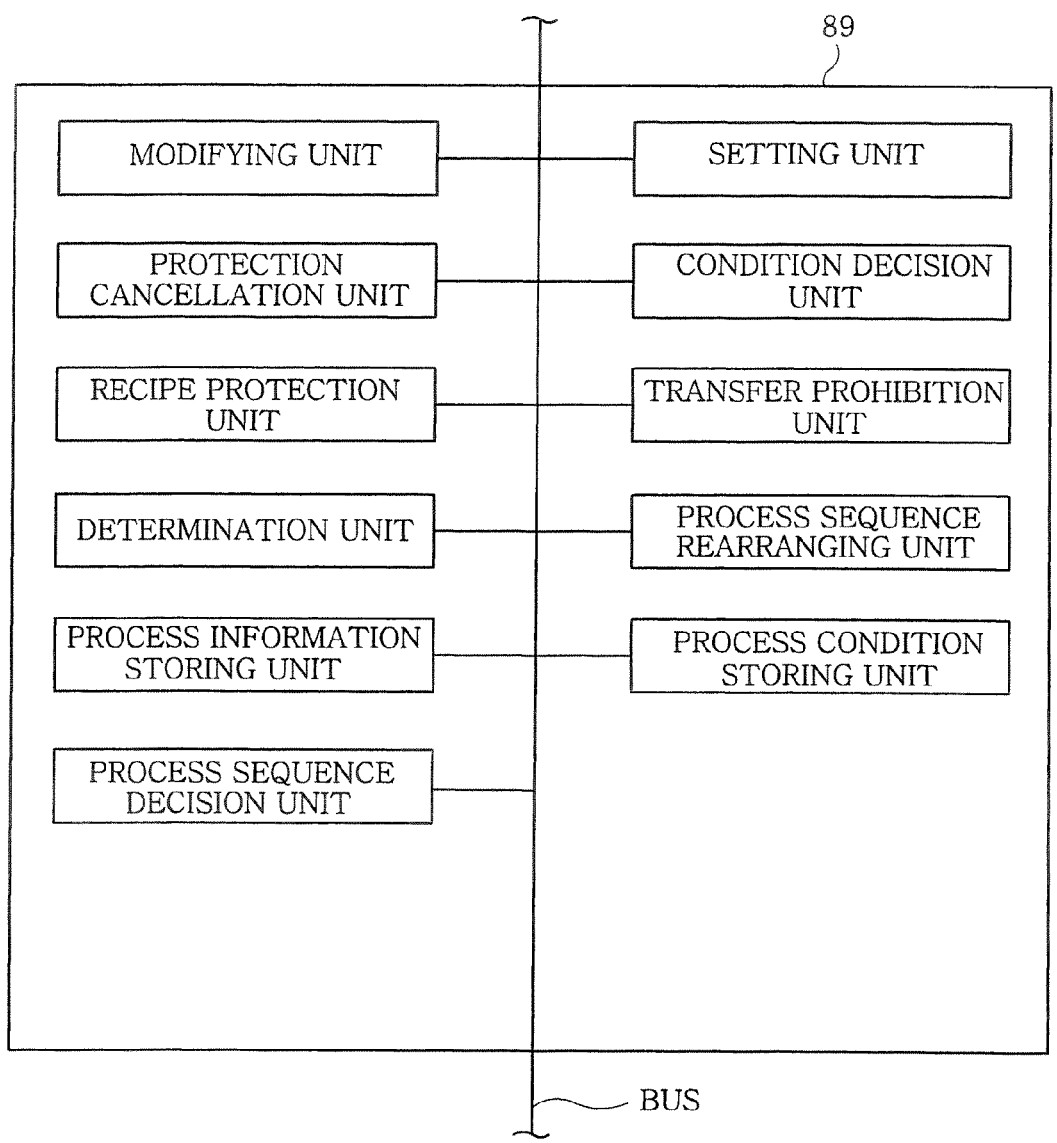
FIG. 14 presents a block diagram showing a configuration of the EC shown in FIG. 4.

As shown in FIG. 14, the EC 89 includes a modifying unit for modifying the recipe for a plasma process; a setting unit for setting a recipe inputted by an operator as the recipe for the plasma processing; a protection cancellation unit for invalidating the recipe buffering function (which will be described later) of the plasma process; a condition decision unit for, according to the modified recipe, determining the recipe for the plasma process to be executed; a recipe protection unit for nullify a recipe modification input; a transfer recipe protection unit for prohibiting a transfer of wafer into a specific process unit. The modifying unit, the setting unit, the protection cancellation unit, the condition decision unit, the recipe protection unit and the transfer recipe protection unit are connected to one another via a bus.

In addition, as shown in FIG. 14, it is also possible that the EC may further include a determination unit; a process sequence rearranging unit; a process information storing unit; a process condition storing unit; and a process sequence decision unit. These units will be described later.

The switching hub 93 selectively connects the EC 89 to the respective MCs according to the control signal from the EC 89.

The MCs 90, 91 and 92 are sub-control units (slave control units) for controlling the operations of the first process ship 11, the second process ship 12 and the loader unit 13, respectively. The MCs are connected to respective I/O (Input/Output) modules 97, 98 and 99 through GHOST network 95 by using DIST (Distribution) boards 96. The GHOST network 95 is implemented by an LSI called a GHOST (General High-Speed Optimum Scalable Transceiver) mounted on an MC board of the MC. The GHOST network 95 can be connected to thirty-one I/O modules at the most. Further, in the GHOST network 95, the MCs are masters, and the I/O modules are slaves.

The I/O module 98 is formed of a plurality of I/O units 100 connected to the respective components (hereinafter, referred to as "end devices") of the second process ship 12, and transfers control signals for the respective end devices and output signals transmitted from the respective end devices. For example, the MFC disposed on the ammonia gas supply line 57, the MFC disposed on the hydrogen fluoride gas supply line 58, the pressure gauge 59 and the APC valve 42 in the second process unit 34, the MFC disposed on the nitrogen gas supply line 65, the pressure gauge 66, the APC valve 69, the buffer arm 52 and the stage heater 51 in the third process unit 36, and the MFC disposed on the nitrogen gas supply line 71, the pressure gauge 72 and the second transfer arm 37 in the second load-lock unit 49 serve as the end devices connected to the I/O units 100 in the I/O module 98.

The configurations of the I/O modules 97 and 99 are identical to that of the I/O module 98. Further, connection relationships between the MC 90 and the I/O module 97 that controls the first process ship 11, and connection relationships between the MC 92 and the I/O module 99 that controls the loader unit 13 are identical to the above-described connection relationships between the MC 91 and the I/O module 98. Therefore, the detailed explanation thereof will be omitted.

Furthermore, the GHOST network 95 is connected to I/O boards (not shown) for controlling the input/output of digital, analog and serial signals to/from the I/O units 100.

When performing the COR process on the wafer W in the substrate processing apparatus 10, the EC 89 transmits control signals to an end device that is to be controlled through the switching hub 93, the MC 91, the GHOST network 95 and the I/O module 98 according to a program corresponding to the recipe of the COR process. In this manner, the EC 89 performs the COR process in the second process unit 34.

To be specific, the EC 89 controls the volumetric flow rate ratio of the ammonia gas to the hydrogen fluoride gas in the processing chamber 38 to be a desired value by transmitting control signals to the MFC disposed on the ammonia gas supply line 57 and the MFC disposed on the hydrogen fluoride gas supply line 58. Further, the EC 89 controls the pressure in the processing chamber 38 to be a desired level by transmitting control signals to the TMP 41 and the APC valve 42. Furthermore, at this time, the pressure gauge 59 sends data on the pressure in the processing chamber 38 to the EC 89 as an output signal; and the EC 89 determines control parameters of the MFC of the ammonia gas supply line 57, the MFC of the hydrogen fluoride gas supply line 58, the APC valve 42, and TMP 41 on the basis of the transmitted data on the pressure in the processing chamber 38.

Further, when performing the PHT process on the wafer W, the EC 89 transmits control signals to an end device to be controlled in accordance with a program corresponding to the recipe of the PHT process to thereby carry out the PHT process in the third process unit 36.

More specifically, the EC 89 controls the pressure in the processing chamber 50 to be a desired level by transmitting control signals to the MFC disposed on the nitrogen gas supply line 65 and the APC valve 69. Further, the EC 89 controls the temperature of the wafer W to be a desired level by transmitting control signals to the stage heater 51. Further, at this time, the pressure gauge 66 sends data on the pressure in the processing chamber 50 to EC 89 as an output signal; and the EC 89 determines control parameters of the APC valve 69 or the MFC of the nitrogen gas supply line 65 on the basis of the transmitted data on the pressure in the processing chamber 50.

In the system controller shown in FIG. 4, a plurality of end devices are not directly connected to the EC 89 but connected to the I/O units 100 that are respectively modularized to form I/O modules; and each of the I/O module is connected to the EC 89 through the MC and the switching hub 93. In this manner, the communications system can be simplified.

Further, the control signal transmitted by the EC 89 includes an address of the I/O unit 100 connected to the end device to be controlled and an address of the I/O module having the I/O unit 100. Thus, the switching hub 93 refers to the address of the I/O module included in the control signal; and the GHOST of the MC refers to the address of the I/O unit 100 included in the control signal. Accordingly, the switching hub 93 and the MC need not send an inquiry about a transmission source of the control signal to the CPU. In this manner, the control signal can be transferred efficiently.

In the above-described substrate processing apparatus 10, if electronic devices are produced by performing the RIE, COR or PHT process on a plurality of wafers W, the operator sets the recipe buffering function to be "valid" by means of the operation panel 88. The recipe buffering function is a function of protecting the recipe from being modified in each of the procedures. Here, while the processes are being performed on a specified number of the wafers W, wherein the specified number is equivalent to, e.g., the number of the wafers forming one lot accommodated in a single FOUP 14, the EC 89 (recipe protection unit) does not accept any recipe modification input by the operator for the first, the second or the third process unit 25, 34 or 36. Further, the EC 89 controls the MC 90 and/or the MC 91 to preserve the recipe for the first, the second or the third process unit 25, 34 or 36.

Further, in the substrate processing apparatus 10, when examining the recipe for each process before starting the production of electronic devices, the operator sets a load start setting function to be "valid" by using the operation panel 88. The load start setting function is a function of the EC 89 to ask the operator whether the recipe buffering function is to be set to be "valid" or "invalid" on the start of the processes on the specified number of the wafers W. If the load start setting function is set to be "invalid," a change is prohibited in a transfer pattern of the wafers W, for example, a transfer sequence or a transfer route (substrate transfer conditions), from the load port 20 to the first process ship 11 or the second process ship 12. However, if the load start setting function is set to be "valid," the prohibition of change in the transfer pattern of the wafers W is cancelled, and thus the operator can set the recipe buffering function to be "valid" or "invalid" by using the operation panel 88.

Figure 5:
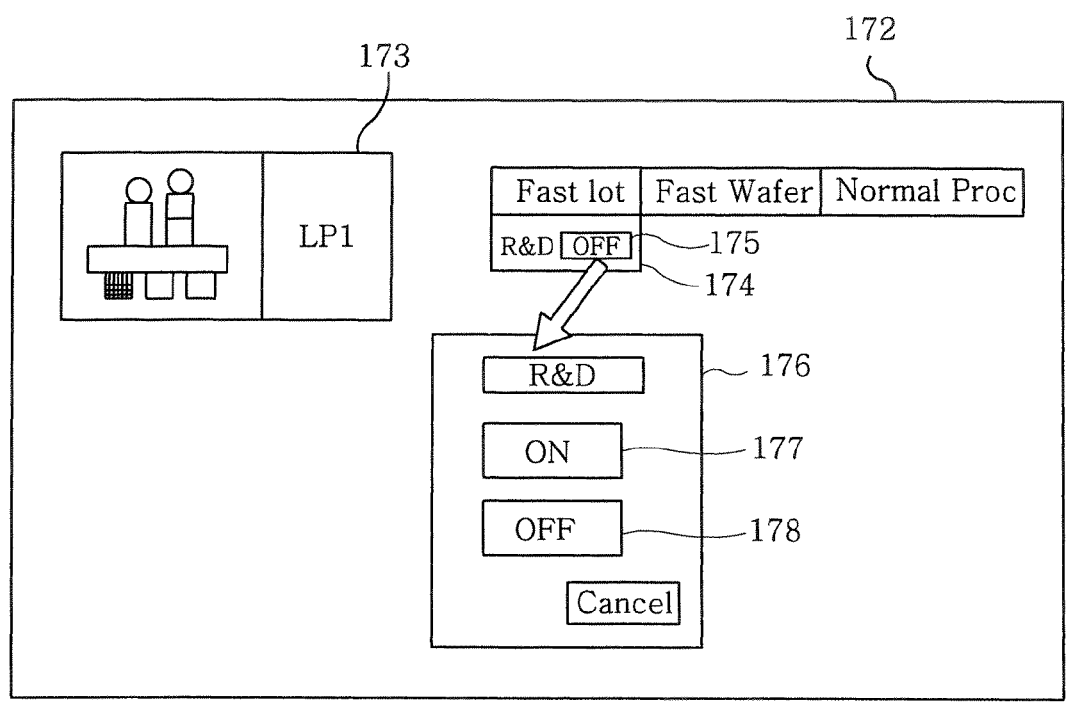
FIG. 5 shows a load port information screen displayed on a display unit of an operation panel when a load start setting function is set to be "valid"

FIG. 5 shows a load port information screen displayed on a display unit of an operation panel when a load start setting function is set to be "valid." The load port information screen is displayed correspondingly to each of the load ports 20.

In FIG. 5, the load port information screen 172 contains therein a load port indicator 173 that indicates the name of the load port 20 corresponding to the load port information screen 172 and the location of the FOUP 14 connected to the load port 20; an "R&D" button 174 displayed when the load start setting function is set to be "valid"; and other buttons.

The "R&D" button 174 has an ON/OFF indicator 175. The ON/OFF indicator 175 is a display unit for indicating that the recipe buffering function has been set to be "valid" or "invalid." Further, when the "R&D" button 174 is pressed, a recipe buffering setting dialogue 176 is displayed. The recipe buffering setting dialogue 176 has an "ON" button 177 and an "OFF" button 178. The EC 89 (protection cancellation unit) sets the recipe buffering function to be "invalid" when the "ON" button 177 is pressed, and to be "valid" when the "OFF" button 178 is pressed. Thus, the operator can protect the recipe from being modified or cancel the protection of the recipe during the time while the specified number of the wafers are being processed, wherein the specified number is equivalent to, e.g., the number of wafers accommodated in one lot in the FOUP 14 connected to the load port 20. That is, the valid or invalid of the recipe buffering function for each lot (in addition, for each load port 20) can be selected.

Further, if the recipe buffering function is set to be "invalid," the EC 89 (modifying unit) displays a recipe modification screen (not shown) on the operation panel 88 in response to a request from the operator, even when a process is being performed on the specified number of wafers W. The operator modifies the recipe for the plasma process to be performed on the wafers W by using the recipe modification screen.

Furthermore, the load port information screen 172 has a unit designation button (not shown) for designating a process unit that selects the state of the recipe buffering function between "valid" and "invalid." Thus, the operator can select the recipe buffering function between "valid" and "invalid" in a processing unit by designating the corresponding process unit.

In the substrate processing apparatus 10, if the recipe buffering function is set to be "invalid," the operator sets a wafer transfer prohibition function to be "valid" by using the operation panel 88. The wafer transfer prohibition function is a function of prohibiting the transfer of wafer into each of the process units. When the wafer transfer prohibition function is set to be "valid" in a process unit information screen (which will be described later), the EC 89 (transfer recipe protection unit) prohibits a transfer of wafer into the process unit corresponding to the process unit information screen.

Figure 6A:
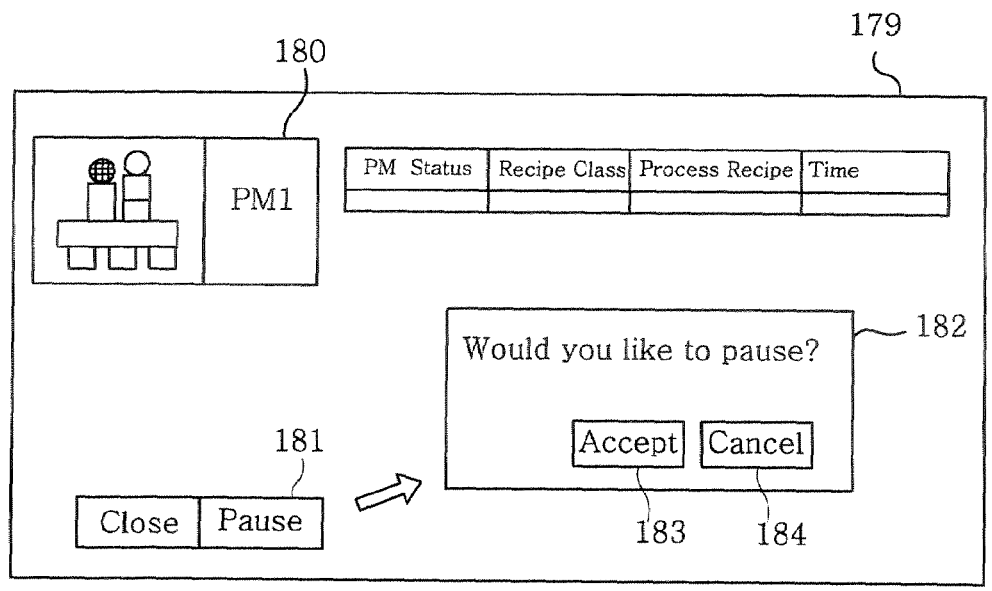
Figure 6B:
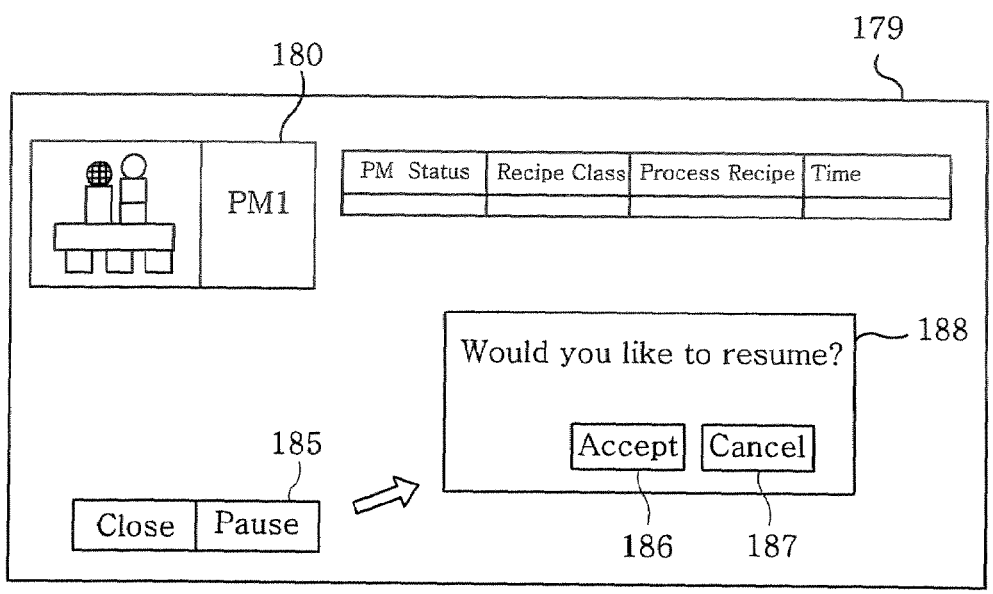
Figure 7A:
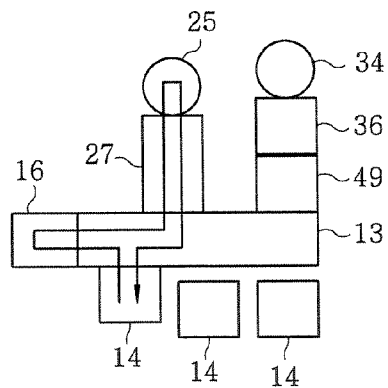
FIGS. 7A to 7D illustrate process diagrams for describing a case where the recipe is modified by using a recipe buffering function and a wafer transfer prohibition function.
Figure 7B:
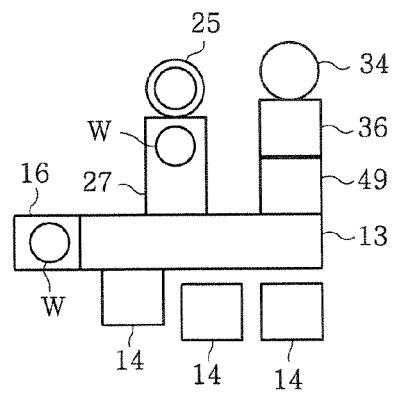
Figure 7C:
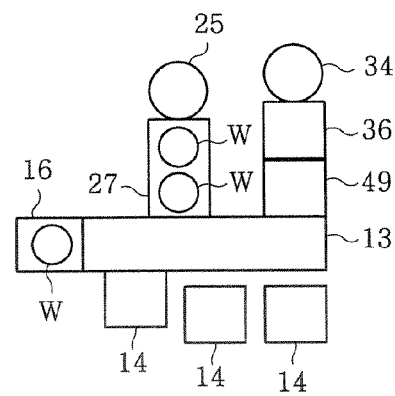
Figure 7D:
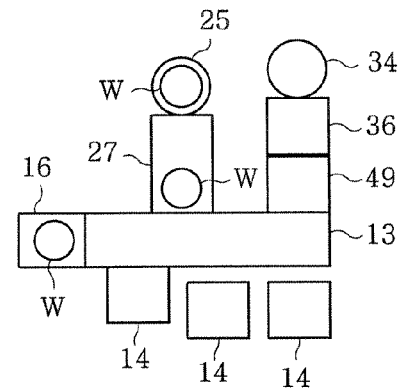

FIGS. 6A and 6B depict a process unit information screen displayed on the display unit of the operation panel, in which FIG. 6A shows a case where a transfer of wafer into the process unit is not prohibited, and FIG. 6B shows a case where a transfer of wafer into the process unit is prohibited. The process unit information screen is displayed correspondingly to each of the process units (the first, the second and the third process unit 25, 34 and 36). Further, the process unit information screen is displayed in such cases as when, for example, the recipe buffering function is set to be "invalid."

In FIG. 6A, the process unit information screen 179 contains therein a process unit indicator 180 that indicates the name of the process unit corresponding to the process unit information screen 179 and the location of the process unit; a "Pause" button 181 displayed if a transfer of wafer into the process unit is not prohibited; and other buttons.

When the "Pause" button 181 is pressed, a pause setting dialogue 182 is displayed. The pause setting dialogue 182 has an "Accept" button 183 and a "Cancel" button 184. The EC 89 sets the wafer transfer prohibition function to be "valid" if the "Accept" button 183 is pressed, and to be "invalid" if the "Cancel" button 184 is pressed. By pressing the "Pause" button 181 and the "Accept" button 183 in the process unit information screen 179 corresponding to a desired process unit, the operator can prohibit the wafer from being transferred into the desired process unit. Further, the "Pause" button 181 may be set to be displayed only when the recipe buffering function is set to be "invalid."

In FIG. 6B, the process unit information screen 179 contains therein the process unit indicator 180; a "Resume" button 185 displayed when a transfer of wafer into the process unit is prohibited; and other buttons. When the "Resume" button 185 is pressed, a resume buffering setting dialogue 188 is displayed. The resume buffering setting dialogue 188 has an "Accept" button 186 and a "Cancel" button 187. The EC 89 sets the wafer transfer prohibition function to be "invalid" if the "Accept" button 186 is pressed, and to be "valid" if the "Cancel" button 187 is pressed. By pressing the "Resume" button 185 and the "Accept" button 186 in the process unit information screen 179 corresponding to the desired process unit, the operator prohibits the wafer from being transferred into the desired process unit.

Alternatively, if the wafer transfer prohibition function is set to be "valid," the EC 89 displays the recipe modification screen on the operation panel 88 in response to the operator's request, and the operator modifies the recipe for the plasma process to be performed on the wafer W by using the recipe modification screen. In this case, the EC 89 (modifying unit) modifies the recipe by following the modification by the operator.

FIGS. 7A to 7D illustrate process diagrams for describing a case where the recipe is modified by using a recipe buffering function and a wafer transfer prohibition function.

First, when examining the recipe by using the specified number of the wafers W, the operator establishes, by using the operation panel 88, a transfer route (that is indicated by an arrow in FIG. 7A) of the wafers W between the FOUP 14 that accommodates therein the specified number of the wafers W and the process unit (the first process unit 25 in the example of FIG. 7A) that modifies the recipe. Further, the operator inputs a desired recipe as the recipe for the first process unit 25 by using the operation panel 88, and the EC 89 (setting unit) sets the inputted recipe as the recipe for the RIE process to be performed on the specified number of the wafers W in the first process unit 25. The recipe is set up for the first process unit 25. Furthermore, the operator sets the recipe buffering function of the first process unit 25 to be "invalid" in the load port information screen 172 corresponding to the load port 20 to which the FOUP 14 is connected (see FIG. 7A).

Further, the substrate processing apparatus 10 takes the wafer W out of the FOUP 14, and transfers the wafer W to the loader unit 13, the orienter 16, the first process unit 25 and the first load-lock unit 27. At this time, the RIE process based on the prepared recipe is performed on the wafer W in the first process unit 25 (see FIG. 7B).

When the recipe prepared in the first process unit 25 is modified, the operator sets the wafer transfer prohibition function of the first process unit 25 to be "valid" by using the process unit information screen 179 corresponding to the first process unit 25. In this case, the wafer W, on which the RIE process has been performed in the first process unit 25, is taken out of the first process unit 25 and transferred into the first load-lock unit 27. Further, other wafers W are locked in the first load-lock unit 27, the orienter 16 or the loader unit 13, so that they are not transferred into the first process unit 25. Furthermore, when the wafer W on which the RIE process has been performed are taken out of the first process unit 25, the recipe modification screen is displayed on the operation panel 88, and the operator modifies the recipe for the first process unit 25 by using the operation panel 88. The modified recipe is prepared in the first process unit 25 (see FIG. 7C).

When the modified recipe is prepared in the first process unit 25, the operator sets the wafer transfer prohibition function of the first process unit 25 to be "invalid" by using the process unit information screen 179 corresponding to the first process unit 25. Accordingly, the wafer W that has been locked in the first load lock 27 is transferred into the first process unit 25, and thus the RIE process based on the modified recipe is performed on the wafer W (see FIG. 7D).

Alternatively, if the wafer transfer prohibition function of the first process unit 25 is set to be "valid," each of the wafers W may return to the FOUP 14 instead of being locked in the first load-lock unit 27, the orienter 16 or the loader unit 13.

Hereinafter, there will be described a recipe examination performed in the substrate processing apparatus in accordance with the present embodiment.

The recipe examination is performed by having the EC 89 control the operations of the first and the second process ship 11 and 12 and the loader unit 13 in accordance with a program or an input from the operator. Further, although the recipe examination may be applied to any of the first, the second and the third process unit 25, 34 and 36, only the case where it is applied to the first process unit 25 will be described below for simplicity.

Figure 8:
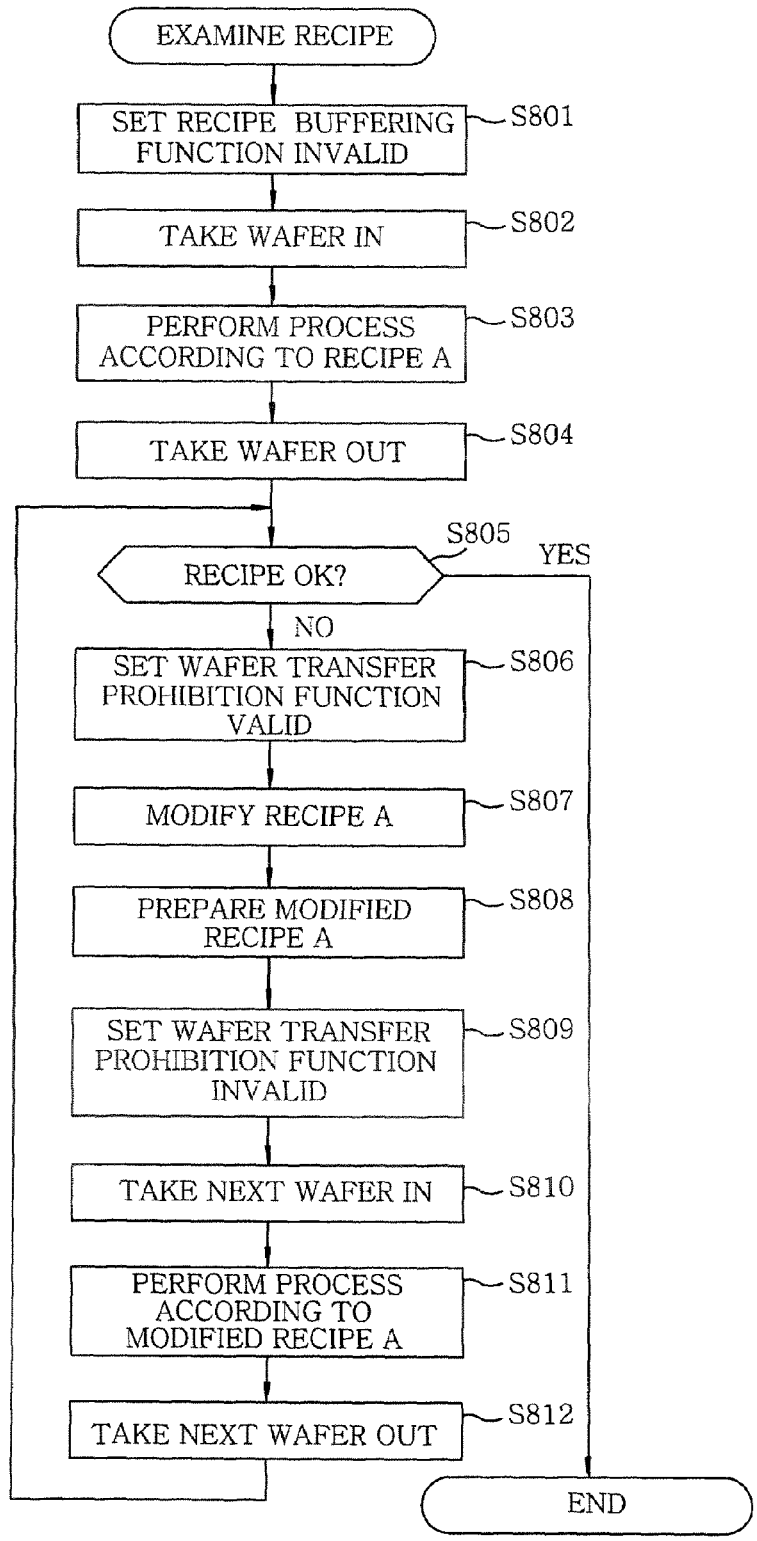
FIG. 8 is a flow chart illustrating recipe examination procedures performed in the substrate processing apparatus in accordance with a first embodiment of the present invention.

FIG. 8 is a flow chart illustrating recipe examination procedures performed in the substrate processing apparatus in accordance with a first embodiment of the present invention.

As shown in FIG. 8, in case of performing the recipe examination while the RIE process is being performed on the specified number of the wafers, recipe A is inputted by the operator as the recipe for the RIE process to be performed on the specified number of the wafers W, and the recipe buffering function is set to be "invalid" to cancel the prohibition of recipe modification. Then, the EC 89 sets recipe A as the recipe for the RIE process to be performed on the wafers W, prepares recipe A in the first process unit 25, and sets the recipe buffering function of the first process unit 25 to be "invalid" (step S801). In this case, the display unit of the operation panel 88 displays the process unit information screen 179 corresponding to the first process unit 25. Further, the process unit information screen 179 displays the "Pause" button 181, because a transfer of wafer into the process unit is not prohibited.

Thereafter, the wafer is carried from the FOUP 14 into the first process unit 25 via the loader unit 13 or the first load-lock unit 27 (step S802); and the RIE process based on recipe A is performed on the wafer W (step S803). At this time, a light emitting state of the plasma in the first process unit 25 is measured.

Thereafter, the wafer W on which the RIE process has been performed is taken out of the first process unit 25 (step S804); and it is determined whether or not recipe A was appropriate as the recipe for the RIE process, based on the results of measurement of the light emitting state of the plasma (step S805).

If, as a result of the determination at step S805, recipe A is determined to have been appropriate as the recipe for the RIE process, the present process is terminated. In contrast, if recipe A is determined to have been inappropriate as the recipe for the RIE process ("NO" at step S805), the process proceeds to step S806.

Thereafter, if the "Pause" button 181 is pressed by the operator, the EC 89 sets the wafer transfer prohibition function of the first process unit 25 to be "valid" (step S806). At this time, the process unit information screen 179 displays the "Resume" button 185. Further, when the wafer W is taken out of the first process unit 25, the operation panel 88 displays the recipe modification screen. The EC 89 modifies recipe A in accordance with a recipe modification input of recipe A (i.e., an input by the operator that requests a modification of recipe A) (step S807); and prepares the modified recipe A in the first process unit 25 (step S808).

In the above, the term "modification of recipe A" refers to a change in the value of at least one parameter in recipe A, but does not refer to a case where recipe A stored in the HDD or the like of the EC 89 is changed into another recipe (recipe B, for example) that has a different name. Generally speaking, differences between a recipe and a modified recipe thereof are small, and plasma processes based on a recipe and a modified recipe thereof are closely related to each other. However, differences between a recipe and another recipe that has a different name are significant, and plasma processes based on a recipe and another recipe that has a different name are not closely related to each other.

After the modified recipe A is prepared, if the "Resume" button 185 is pressed by the operator, the EC 89 sets the wafer transfer prohibition function of the first process unit 25 to be "invalid" (step S809).

Thereafter, a next wafer W is carried into the first process unit 25 (step S810); and the RIE process based on the modified recipe A is performed on the wafer W (step S811). In this case as well, the light emitting state of the plasma is measured in the first process unit 25. Then, the wafer W is taken out of the first process unit 25 (step S812), and the process returns to step S805.

According to the process shown in FIG. 8, the recipe buffering function is set to be "invalid," to cancel the prohibition of recipe modification while the RIE process is performed on the specified number of the wafers W, and thus recipe A prepared in the first process unit 25 is modified. Therefore, recipe A can be modified without waiting until the RIE process is performed on all of the specified number of the wafers W. Accordingly, the recipe can be examined without delay.

In the process shown in FIG. 8, the wafer transfer prohibition function of the first process unit 25 is set to be "valid," and thus it is not necessary to stop a transfer of wafer into the second process unit 34 or the third process unit 36 in order to prevent the wafers W from being erroneously carried into the first process unit 25; and the COR and PHT process can be continued in the second the third process unit 34 and 36, respectively. Thus, a reduction in productivity can be prevented. Further, since recipe A is modified while the wafer transfer prohibition function of the first process unit 25 is set to be "valid," the recipe can be examined efficiently without unnecessarily performing the RIE process (more specifically, the RIE process based on recipe A) on a next wafer W.

In the above, in the recipe examination, the case where recipe A is modified has been described; hereinafter, a case where recipe A is changed into recipe B will be described.

Figure 9:
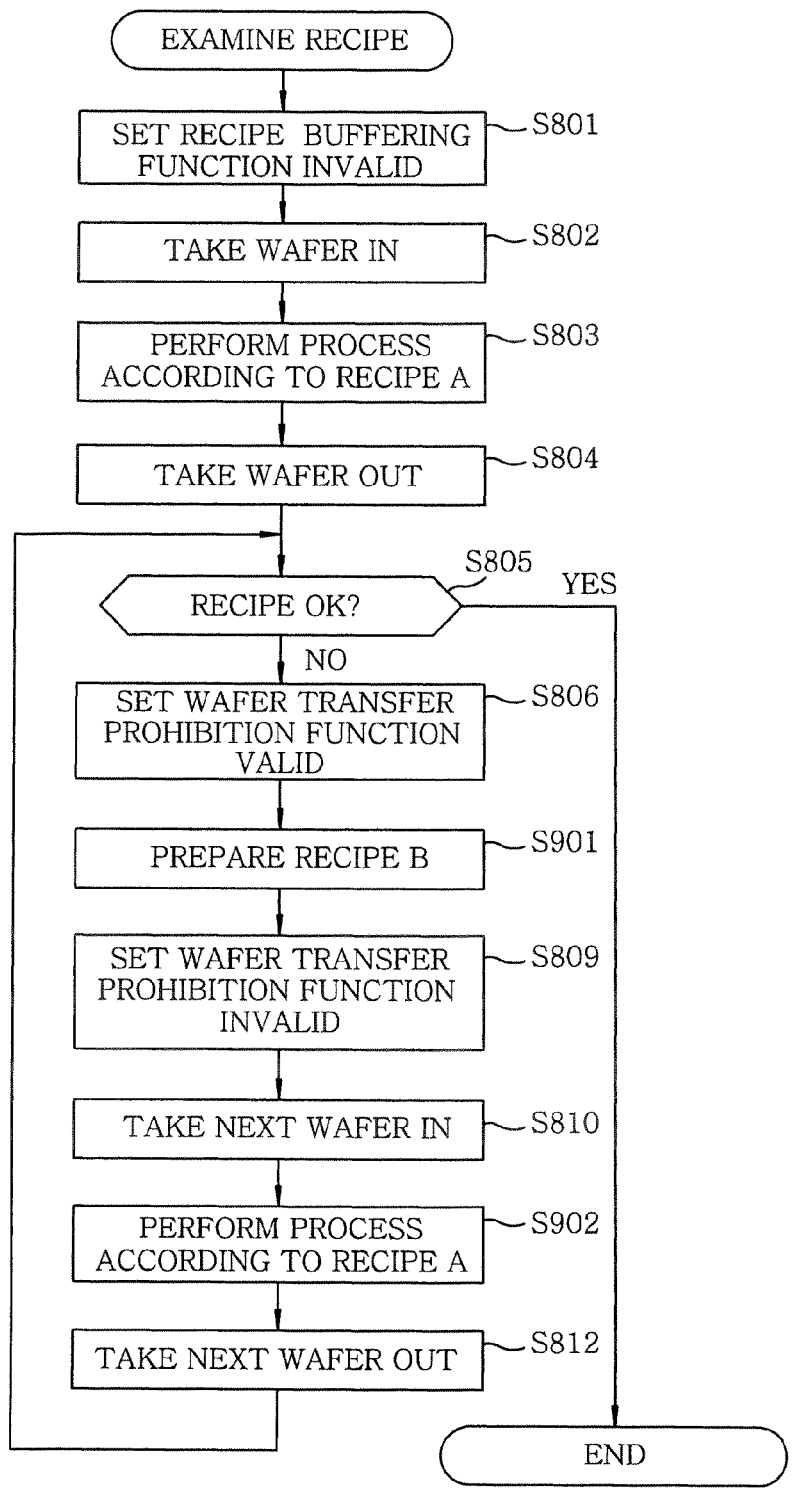
FIG. 9 is a flow chart showing recipe examination procedures performed in the substrate processing apparatus in accordance with a modified example of the first embodiment.

FIG. 9 is a flow chart showing recipe examination procedures performed in the substrate processing apparatus in accordance with a modified example of the first embodiment. Herein, same step numbers are assigned to same steps as those shown in FIG. 8, and descriptions thereof will be omitted in the following.

In FIG. 9, if the EC 89 sets the wafer transfer prohibition function of the first process unit 25 to be "valid" (step 806), and thus the wafer W is taken out of the first process unit 25, the operation panel 88 displays the recipe modification screen. The EC 89 prepares a changed recipe B for the first process unit 25 in accordance with a change input by the operator for changing recipe A into recipe B (step S901). Recipe B has a name different from that of recipe A, and the differences therebetween are significant. Further, the RIE processes based on the above two recipes are not closely related to each other.

After preparing the changed recipe B and carrying a next wafer W into the first process unit 25 (step S810), the EC 89 (condition decision unit) performs the RIE process based on recipe A on the wafer W (step S902). In this case as well, the light emitting state of the plasma in the first process unit 25 is measured.

In the processes of FIGS. 8 and 9, if recipe A is set to be the recipe for the RIE process to be performed on the specified number of the wafers W, when recipe A is modified, the modified recipe A is prepared in the first process unit 25, and the RIE process based thereon is performed on the wafers W. However, if recipe A is changed into recipe B, the changed recipe B is prepared in the first process unit 25, but the RIE process based on not recipe B but recipe A is performed on the wafers W.

In other words, when recipe A is modified or changed, the recipe (the modified recipe A or recipe A) for the RIE process to be performed on the wafers W in the first process unit 25 is determined based on the differences between recipe A and the modified or changed recipe. Thus, the RIE process on the wafers W can be prevented from being performed in accordance with recipe B, which differs significantly from recipe A. Since the process would not be closely related to a process based on recipe A, if a process based on recipe B were performed on the wafers W, the results of the RIE process based on recipe B would not be useful for modifying recipe A. Accordingly, in accordance with the present embodiment, the recipe can be protected from a useless change, and thus can be examined more efficiently.

Hereinafter, a substrate processing apparatus in accordance with a second embodiment of the present invention will be described.

The configuration and operation of the present embodiment are basically same as those of the first embodiment; and, in the present embodiment, only the recipe examination is different from that of the first embodiment. Accordingly, hereinafter, a description of such features that are same as those of the first embodiment will be omitted, and only different features will be described.

The recipe examination process performed in the substrate processing apparatus in accordance with the present embodiment can be applied to any of the first, the second and the third process unit 25, 34 and 36. However, for simplicity, only a case where the recipe examination process is applied to the first process unit 25 will be described in the following.

Figure 10:
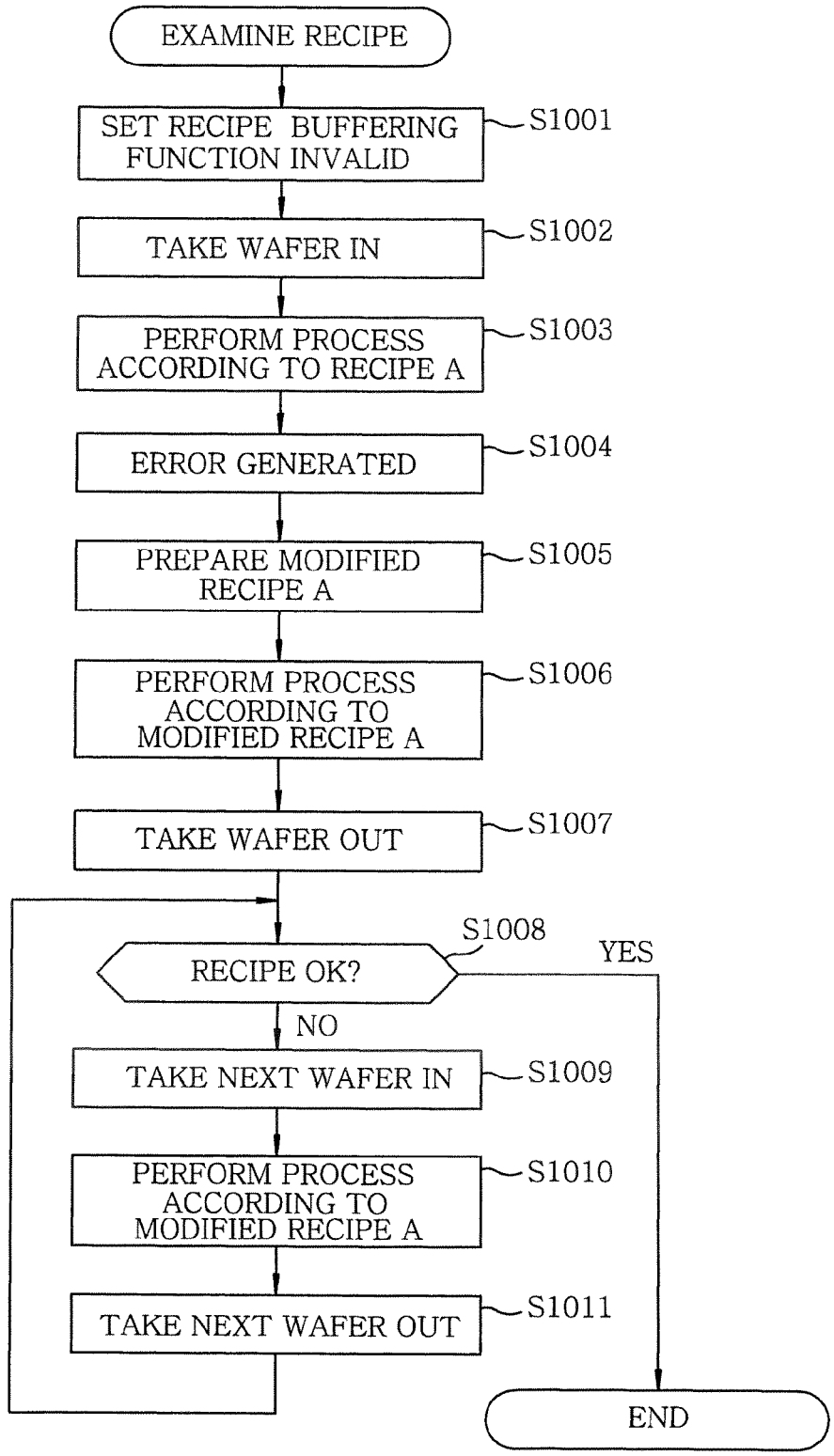
FIG. 10 is a flow chart describing recipe examination procedures performed in the substrate processing apparatus in accordance with a second embodiment of the present invention.

FIG. 10 is a flow chart describing recipe examination procedures performed in the substrate processing apparatus in accordance with a second embodiment of the present invention As shown in FIG. 10, in case of performing the recipe examination while the RIE process is performed on the specified number of the wafers, recipe A is inputted by the operator as the recipe for the RIE process to be performed on the specified number of the wafers W, and the recipe buffering function is set to be "invalid" to cancel the prohibition of recipe modification. Then, the EC 89 sets recipe A as the recipe for the RIE process to be performed on the specified number of the wafers W, prepares recipe A in the first process unit 25, and sets the recipe buffering function of the first process unit 25 to be "invalid" (step S1001).

Thereafter, the wafer is carried from the FOUP 14 into the first process unit 25 via the loader unit 13 or the first load-lock unit 27 (step S1002); and the RIE process based on recipe A is performed on the wafer W (step S1003). At this time, a light emitting state of the plasma in the first process unit 25 is measured.

Subsequently, if an error occurs while the RIE process based on recipe A is being performed in the first process unit 25 (step S1004), the EC 89 stops the RIE process in the first process unit 25. In this case, the wafer W is not carried out of the first process unit 25, but is locked in the first process unit 25. Further, the operation panel 88 displays the recipe modification screen. Then, EC 89 changes recipe A in accordance with an input by the operator for modifying the recipe, and the modified recipe A is prepared in the first process unit 25 (step S1005).

Thereafter, the RIE process based on the modified recipe A is performed on the wafers W (step S1006). At this time, the light emitting state of the plasma in the first process unit 25 is measured.

Then, the wafer W on which the RIE process has been performed is carried out of the first process unit 25 (step S1007); and it is determined whether or not the modified recipe A was appropriate as the recipe for the RIE process, based on the results of measurement of the light emitting state of the plasma (step S1008).

If, as a result of the determination at step S1005, the modified recipe A is determined to have been appropriate as the recipe for the RIE process ("YES" at step S1008); the present process is terminated. In contrast, if the modified recipe A is determined to have been inappropriate as the recipe for the RIE process ("NO" at step S1008), the process proceeds to step S1009.

Then, a next wafer W is transferred into the first process unit 25 (step S1009); and the RIE process based on the modified recipe A is performed on the wafer W (step S1010). In this case as well, the light emitting state of the plasma is measured in the first process unit 25. Thereafter, the wafer W is carried out of the first process unit 25 (step S1011); and the process returns to step 1008.

In accordance with the process shown in FIG. 10, if an error occurs while the RIE process based on recipe A is being performed on the specified number of the wafers W, recipe A prepared in the first process unit 25 is modified. For this reason, recipe A can be modified without waiting until the RIE process is performed on all the wafers W, and thus the recipe can be examined without delay. Furthermore, since the RIE process based on the recipe by which the error was occurred is not performed again, a useless RIE process is prevented from being performed on the wafer W, and thus the recipe can be examined more efficiently.

In the above, in the recipe examination, the case where recipe A is modified has been described; hereinafter, a case where recipe A is changed into recipe B will be described.

Figure 11:
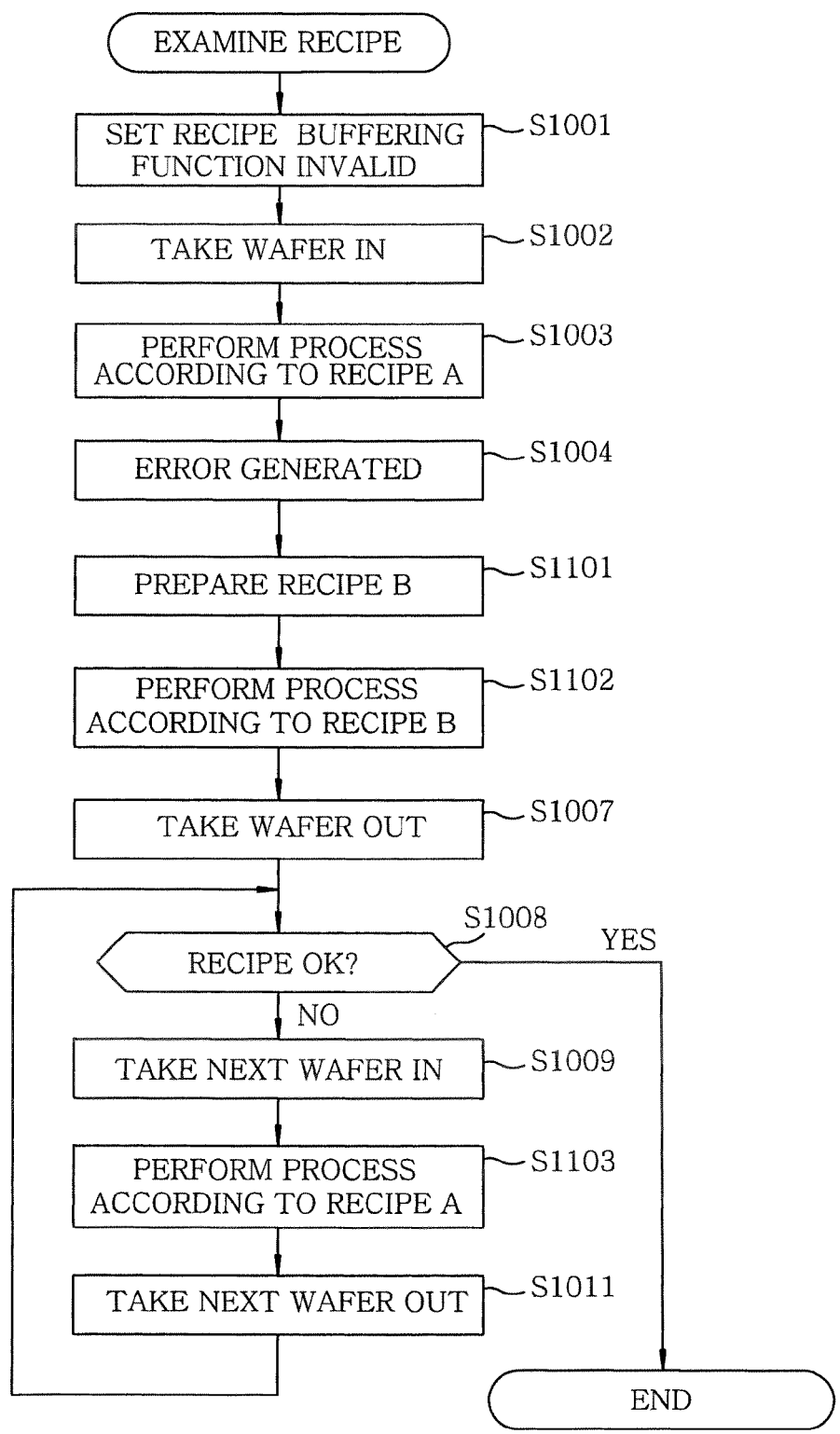
FIG. 11 is a flow chart illustrating recipe examination procedures performed in the substrate processing apparatus in accordance with a modified example of the second embodiment.

FIG. 11 is a flow chart showing recipe examination procedures performed in the substrate processing apparatus in accordance with the present embodiment. Herein, same step numbers are assigned to same steps as those shown in FIG. 8, and descriptions thereof will be omitted in the following.

In FIG. 11, if an error occurs while the RIE process based on recipe A is being performed in the first process unit 25 (step S1004), the EC 89 stops the RIE process in the first process unit 25. Further, the operation panel 88 displays the recipe modification screen. Then, in response to an input by the operator for changing the recipe from recipe A to recipe B, the EC 89 prepares the changed recipe B for the first process unit 25 (step S1101).

Thereafter, the RIE process based on the changed recipe B is performed on the wafers W (step S1102). At this time, a light emitting state of the plasma in the first process unit 25 is measured.

Then, if it is determined that the changed recipe B was not appropriate as the recipe for the RIE process ("NO" at step S1008), a next wafer W is carried into the first process unit 25 (step S1009); and the EC 89 (condition decision unit) performs the RIE process based on recipe A on the wafer W (step S1103). In this case as well, a light emitting state of the plasma in the first process unit 25 is measured.

In the processes shown in FIGS. 10 and 11, if an error occurs while the RIE process based on recipe A is being performed in the first process unit, the wafer W is locked in the first process unit 25. In this case, if recipe A is modified, the modified recipe A is prepared in the first process unit 25, and the RIE process based on the modified recipe A is performed on the wafer A locked in the first process unit 25 and a wafer W subsequent to the locked wafer W (hereinafter referred to as "subsequent wafer W") as well. Further, if recipe A is changed into recipe B, the changed recipe B is prepared in the first process unit 25, and the RIE process based on the changed recipe B is performed on the wafer W locked in the first process unit 25. However, in this case, the RIE process based on not recipe B but recipe A is performed on the subsequent wafer W.

In other words, if recipe A is modified or changed, the recipe (the modified recipe A or recipe A) for the RIE process to be performed on the subsequent wafer W is determined based on the differences between recipe A and the modified or changed recipe. Thus, the RIE process can be prevented from being performed on the wafer W in accordance with recipe B, which differs significantly from recipe A. Accordingly, the recipe can be protected from being irrelevantly changed, and thus the recipe can be examined more efficiently.

In case of applying the processes shown in FIGS. 8 to 11 to the second process unit 34 or the third process unit 36, it is determined whether or not the modified or changed recipe is appropriate as the recipe for the COR or PHT process, based on the shape of a trench formed on the surface of the wafer W.

In the above-described embodiments, the operator modifies or changes the recipe by using the operation panel 88. However, it is also possible that a PC (MES) 171 that is an external device may transmit operation instructions for modifying or changing the recipe to the substrate processing apparatus 10. In this case, the determination unit shown in FIG. 14 determines whether or not a change in transfer pattern of the wafers W in response to the operation instructions has been prohibited. If it is determined that a change in transfer pattern has not been prohibited, it is determined whether or not a transfer of substrate into the substrate processing unit has been prohibited. However, if it is determined that a change in transfer pattern has been prohibited, the operation instructions from the PC 171 are not accepted, and the transmission of the recipe to an outside of the substrate processing apparatus 10 is prohibited.

Therefore, if is determined that a change in transfer pattern has not been prohibited, two determination procedures are performed before the wafer W is carried into the first process unit 25 or the second process unit 34 for which the recipe is changed or modified. Accordingly, even if there are some operation instructions from the PC 171, the wafers W are prevented from being erroneously carried into the first process unit 25 for which the recipe is modified or changed. Further, if it is determined that a change in the transfer pattern has been prohibited, it is guaranteed that an erroneous change in recipe can be prevented both inside and outside the substrate processing apparatus 10.

Further, in the above-described embodiments, a wafer process flow including a plurality of procedures may be modified by changing the attributes of the procedures by the process sequence rearranging unit shown in FIG. 14, so that the process flow can be easily modified. Furthermore, in the substrate processing apparatus 10, process information including process IDs that represent contents of the respective procedures in the process flow is stored in the process information storing unit shown in FIG. 14, and a recipe including the sequence of procedures in the process flow is also stored in the process condition storing unit shown in FIG. 14.

Then, in a recipe having process IDs, transfer pattern IDs "CJ-ID" and recipe IDs "PJ-ID" for the plasma process, the process sequence decision unit shown in FIG. 14 determines whether or not the sequence of procedures is to be accepted or whether or not there is any sequence of procedures. Then, if it is determined that the sequence of procedures is not to be accepted or there is no sequence of the procedures, the process flow is modified by providing a warning to the operator, changing the sequence of procedures, adding procedure(s) or removing any of the procedures. Therefore, at least one determination is performed until the process flow has been modified. Accordingly, the process flow can be prevented from being carelessly modified.

In the substrate processing apparatus in accordance with the above-described embodiment of the present invention, the two process ships have been described to be of different structures. However, it is also possible that the two process ships are of a same structure. For example, both of the process ships may be of a structure for performing an RIE process on the wafer W.

Further, in the substrate processing apparatus in accordance with the above-described embodiment of the present invention, a target substrate to be processed by an RIE process or the like is not limited to a semiconductor wafer for an electronic device. Instead, various kinds of substrates such as a photo mask, a CD substrate, a print substrate or a substrate used for, e.g., an LCD (Liquid Crystal display), a FPD (Flat Panel Display) or the like can also be used as the target substrate.

Further, the substrate processing apparatus in accordance with the above-described embodiment of the present invention is not limited to a parallel type substrate processing apparatus having two process ships disposed parallel to each other as shown in FIG. 1. Instead, the present invention can also be applied to a substrate processing apparatus in which a plurality of process units serving as vacuum processing units for performing specific processes on the wafer W are disposed radially as shown in FIGS. 12 and 13.

Figure 12:
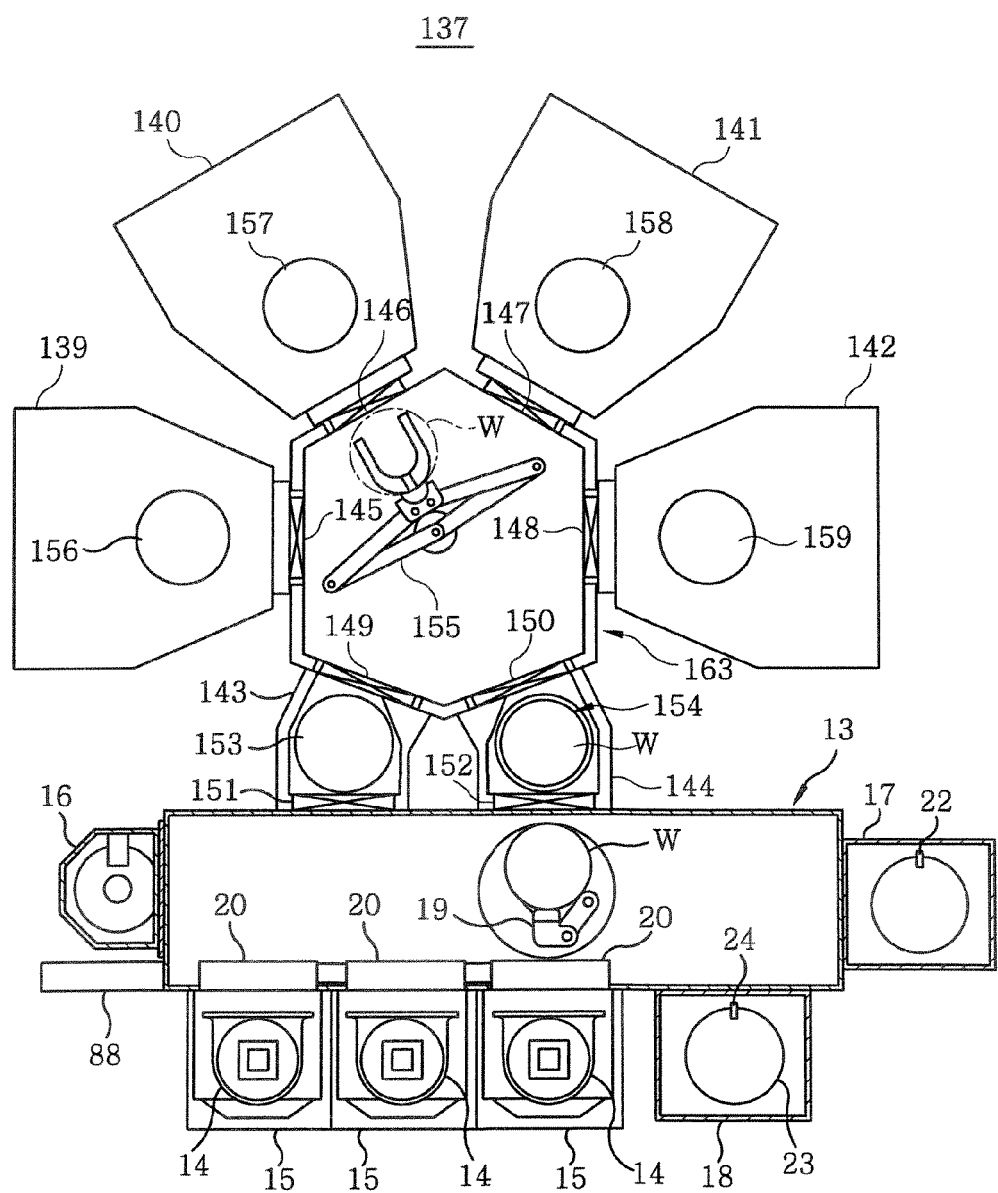
FIG. 12 is a plan view for schematically showing a configuration of a substrate processing apparatus in accordance with a first modified example of the embodiment of the present invention.
Figure 13:
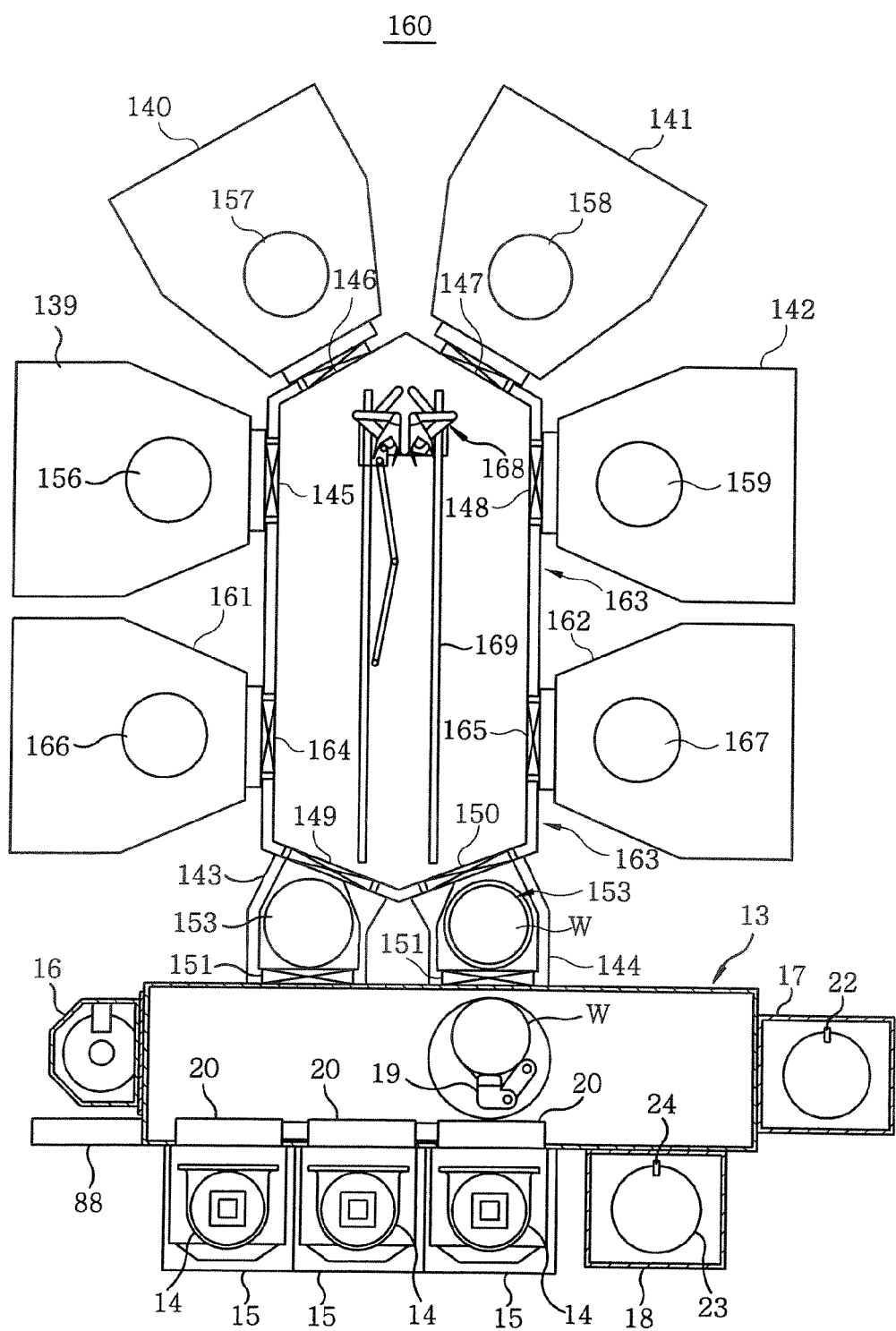
FIG. 13 is a plan view for schematically showing a configuration of a substrate processing apparatus in accordance with a second modified example of the embodiment of the present invention.

FIG. 12 is a plan view for schematically showing a configuration of a substrate processing apparatus in accordance with a first modified example of the embodiment of the present invention. As shown in FIG. 12, like parts identical to those of the substrate processing apparatus 10 in FIG. 1 are given like reference numerals, and description thereof will be omitted.

As shown in FIG. 12, a substrate processing apparatus 137 includes a transfer unit 138 that is of a hexagonal shape when views from a plane; four process units 139 to 142 arranged radially around the transfer unit 138; a loader unit 13; and two load-lock units 143 and 144 disposed between the transfer unit 138 and the loader unit 13 for connecting the transfer unit 138 to the loader unit 13.

Pressures in the transfer unit 138 and the process unit 139 to 142 are maintained at a vacuum level, and the transfer unit 138 is connected to the process units 139 to 142 via vacuum gate valves 145 to 148, respectively.

In the substrate processing apparatus 137, a pressure in the loader unit 13 is maintained at an atmospheric level, whereas a pressure in the transfer unit 138 is maintained at a vacuum level. On this account, the load-lock units 143 and 144 are configured as vacuum antechambers whose internal pressures are controllable by vacuum gate valves 149 and 150, respectively, together with atmospheric door valves 151 and 152, respectively. Here, the vacuum gate valves 149 and 150 are disposed at connection parts of the transfer unit 138 that is connected to the load-lock unit 143 and the load-lock unit 144, respectively. Further, the load-lock units 143 and 144 have wafer mounting tables 153 and 154, respectively, for temporarily supporting a wafer W transferred between the loader unit 13 and the transfer unit 138.

The transfer unit 138 has a frog-leg type transfer arm 155 disposed therein, which can be freely extended, retracted and rotated. The transfer arm 155 transfers the wafer W between the process units 139 to 142 and the load-lock units 143 and 144.

The process units 139 to 142 have mounting tables 156 to 159, respectively, for mounting thereon the wafer W to be processed. Herein, the configuration of each of the process units 139 and 140 is same as that of the first process unit 25 in the substrate processing apparatus 10. Further, the process unit 141 is of the same configuration as that of the second process unit 34, and the configuration of the process unit 142 is of the same configuration as that of the third process unit 36.

Further, the operation of each component in the substrate processing apparatus 137 is controlled by a system controller that is of the same configuration as that of the system controller in the substrate processing apparatus 10.

FIG. 13 is a plan view for schematically illustrating a configuration of a substrate processing apparatus in accordance with a second modified example of the embodiment of the present invention. As shown therein, like parts identical to those of the substrate processing apparatus 10 shown in FIG. 1 or the substrate processing apparatus 137 shown in FIG. 12 are given like reference numerals, and description thereof will be omitted.

As shown in FIG. 13, the substrate processing apparatus 160 further includes two process units 161 and 162 in addition to the components of the substrate processing apparatus 137 shown in FIG. 12. Further, the substrate processing apparatus 160 includes a transfer unit 163 instead of the transfer unit 138 in the substrate processing apparatus 137, wherein the transfer unit 163 is a shape different from that of the transfer unit 138. The process units 161 and 162 are coupled to the transfer unit 163 through vacuum gate valves 164 and 165, and include mounting tables 166 and 167, respectively, for mounting therein the wafer W. The process unit 161 has of the same configuration as that of the first process unit 25, and the configuration of the process unit 162 is same as that of the second process unit 34.

Further, the transfer unit 163 is provided with a transfer arm unit 168 formed of two scalar arm type transfer arms. The transfer arm unit 168 is moved along a guide rail 169 disposed in the transfer unit 163, and transfers the wafer W between the process units 139 to 142, 161 and 162 and the load-lock unit 143 and 144.

Furthermore, the operation of each component of the substrate processing apparatus 160 is controlled by a system controller that is of the same configuration as that of the system controller in the substrate processing apparatus 10.

The object of the present invention can also be achieved by providing the EC 89 with a storage medium for storing therein software program codes for executing the functions of the above-described embodiments, and having a computer (or a CPU, MPU or the like) in the EC 89 read and execute the program codes stored in the storage medium.

In this case, it is the program codes read from the storage medium that implements the functions of the above-described embodiments. Therefore, the program codes and the storage medium for storing the program codes therein should be regarded as aspects of the present invention.

Further, as the storage medium for storing therein the program codes, a floppy (registered trademark) disc, a hard disc, a magneto-optical disc, an optical disc such as a CD-ROM, a CD-R, a CD-RW, a DVD-ROM, a DVD-RAM, a DVD-RW or a DVD+RW, a magnetic tape, a nonvolatile memory card and a ROM may be employed. Furthermore, the program codes may be downloaded through the network.

In the above description, the computer reads and executes the program codes to implement the functions of the above-described embodiments However, it is also possible to implement the functions of the above-described embodiments by having an OS (operating system) or the like that is operated for the computer execute the entire or a part of actual processes based on instructions of the program codes.

Further, it is also possible to implement the functions of the above-described embodiments by storing the program code into a memory in a function extension board installed in the computer or in a function extension unit connected to the computer, and having a CPU or the like installed in the function extension board or the function extension unit execute the entire or a part of actual processes based on instructions of the program codes.

Furthermore, the form of the above-mentioned program codes may be an object code, a program code executed by an interpreter, script data provided to an OS, or the like.

While the invention has been shown and described with respect to the embodiments, it will be understood by those skilled in the art that various changes and modification may be made without departing from the scope of the invention as defined in the following claims.

What is claimed is:

1. A substrate processing apparatus, comprising:
   a substrate processing unit for performing a process on a plurality of substrates of one lot;
   a recipe protection unit for prohibiting processing conditions for the process from being changed while the process is being performed on the substrates;
   a protection cancellation unit for canceling a prohibition of a change in the process to allow the processing conditions to be changed while the process is being performed on the substrates;
   a modifying unit for modifying the processing conditions;
   a transfer recipe protection unit for prohibiting transfer of a substrate from the plurality of substrates into the substrate processing unit;
   a substrate transfer unit for transferring the plurality of substrates; and
   a determination unit for determining whether a change in substrate transfer conditions, that are required for transferring the substrate from the plurality of substrates, has been prohibited in response to a manipulation from an external device for modifying the processing conditions,
   wherein, if the change in the substrate transfer conditions has not been prohibited, the determination unit also determines whether the transfer of the substrate from the plurality of substrates into the substrate processing unit has been prohibited,
   wherein, if the transfer of the substrates into the substrate processing unit has been prohibited, the modifying unit modifies the processing conditions, and
   wherein the change in the substrate transfer conditions includes a change in a transfer sequence or a transfer route of the substrates from a front opening unified pod accommodating the substrates to a processing chamber of the substrate processing unit.

2. The substrate processing apparatus of claim 1, wherein, if the change in the substrate transfer conditions has been prohibited, the manipulation from the external device is not accepted.

3. The substrate processing apparatus of claim 1, wherein, if the change in the substrate transfer conditions has been prohibited, a transmission of the processing conditions to an outside of the substrate processing apparatus is prohibited.

4. The substrate processing apparatus of claim 1, further comprising:
   a setting unit for setting the processing conditions for the process to be performed on the substrates; and
   a condition decision unit for, when processing conditions different from the set processing conditions set by the setting unit are inputted, determining processing conditions for the process to be performed on the substrates by the substrate processing unit based on a difference between the inputted processing conditions and the set processing conditions set by the setting unit.

5. The substrate processing apparatus of claim 1, wherein the processing conditions include at least one of a flow rate ratio of processing gases, a processing temperature of the substrates and an inner pressure of a processing chamber of the substrate processing unit.

6. A method for examining substrate processing conditions, which is to be performed by a substrate processing apparatus that includes a substrate processing unit for performing a process on a plurality of substrates of one lot, and a recipe protection unit for prohibiting processing conditions for the process from being changed while the process is being performed on the substrates, the method comprising:
 a protection cancellation step of canceling a prohibition of a change in the process to allow the processing conditions to be changed while the process is being performed on the substrates;
 a modifying step of modifying the processing conditions;
 a first determination step of determining whether a change in substrate transfer conditions required for transferring a substrate from the plurality of substrates has been prohibited in response to a manipulation from an external device for modifying the processing conditions; and
 a second determination step of, if the change in the substrate transfer conditions has not been prohibited, determining whether a transfer of the substrate from the plurality of substrates into the substrate processing unit has been prohibited,
 wherein, if the transfer of the substrate into the substrate processing unit has been prohibited, the processing conditions are modified at the modifying step, and
 wherein the change in the substrate transfer conditions includes a change in transfer sequence or a transfer route of the substrates from a front opening unified pod accommodating the substrates to a process chamber of the substrate processing unit.

7. The method of claim 6, wherein, if an abnormality occurs in the substrate processing unit, the processing conditions are modified at the modifying step.

8. The method of claim 6, wherein, if the change in the substrate transfer conditions has been prohibited, the manipulation from the external device is not accepted.

9. The method of claim 6, wherein, if the change in the substrate transfer conditions has been prohibited, a transmission of the processing conditions to an outside of the substrate processing apparatus is prohibited.

10. The method of claim 6, further comprising:
 a process information storing step of storing process information that at least includes process IDs that represent contents of the respective procedures in the process flow;
 a processing condition storing step of storing processing conditions that include a sequence of the procedures; and
 a process flow determination step of determining whether or not the sequence of the procedures is accepted or whether or not there is any sequence of the procedures,
 wherein, at the process flow rearranging step, if the sequence of the procedures is not accepted or there is no sequence of the procedures, the sequence of the procedures is modified by providing a warning, changing the sequence of the procedures, adding procedure(s) or removing any of the procedures.

11. The method of claim 6, wherein the processing conditions include at least one of a flow rate ratio of processing gases, a processing temperature of the substrates and an inner pressure of a processing chamber of the substrate processing unit.

12. A non-transitory computer-readable storage medium storing a program for performing, when executed by a computer, a method for examining substrate processing conditions to be performed by a substrate processing apparatus that includes a substrate processing unit for performing a process on a plurality of substrates of one lot, and a recipe protection unit for prohibiting processing conditions for the process from being changed while the process is being performed on the substrates, wherein the program comprises:
 a protection cancellation module for canceling a prohibition of a change in the process to allow the process conditions to be changed while the process is being performed on the substrates;
 a modifying module for modifying the processing conditions;
 a first determination module for determining whether a change in substrate transfer conditions required for transferring a substrate from the plurality of substrates has been prohibited in response to a manipulation from an external device for modifying the processing conditions; and
 a second determination module for determining, if the change in the substrate transfer conditions has not been prohibited, whether a transfer of the substrate from the plurality of substrates into the substrate processing unit has been prohibited,
 wherein, the modifying module modifies the processing conditions if the transfer of the substrate into the substrate processing unit has been prohibited, and
 wherein the change in the substrate transfer conditions includes a change in a transfer sequence or a transfer route of the substrates from a front opening unified pod accommodating the substrates to a processing chamber of the substrate processing unit.

13. The storage medium of claim 12, wherein the processing conditions include at least one of a flow rate ratio of processing gases, a processing temperature of the substrates and an inner pressure of a processing chamber of the substrate processing unit.

* * * * *